US011304308B2

(12) United States Patent
Holec et al.

(10) Patent No.: US 11,304,308 B2
(45) Date of Patent: Apr. 12, 2022

(54) FLEXIBLE CIRCUIT BOARD INTERCONNECTION AND METHODS

(71) Applicant: Metrospec Technology, L.L.C., Mendota Heights, MN (US)

(72) Inventors: Henry V. Holec, Mendota Heights, MN (US); Wm. Todd Crandell, Minnetonka, MN (US); Eric Henry Holec, Mendota Heights, MN (US)

(73) Assignee: Metrospec Technology, L.L.C., Mendota Heights, MN (US)

( * ) Notice: Subject to any disclaimer, the term of this patent is extended or adjusted under 35 U.S.C. 154(b) by 0 days.

(21) Appl. No.: 16/698,127

(22) Filed: Nov. 27, 2019

(65) Prior Publication Data

US 2020/0275556 A1  Aug. 27, 2020

Related U.S. Application Data

(63) Continuation of application No. 15/675,938, filed on Aug. 14, 2017, now Pat. No. 10,499,511, which is a
(Continued)

(51) Int. Cl.
*B23K 1/00*   (2006.01)
*B23K 37/04*  (2006.01)
(Continued)

(52) U.S. Cl.
CPC .......... *H05K 3/363* (2013.01); *B23K 1/0016* (2013.01); *B23K 37/04* (2013.01);
(Continued)

(58) Field of Classification Search
CPC ........ H05K 3/363; H05K 1/144; H05K 1/189; H05K 1/0269; H05K 1/118; H05K 1/147;
(Continued)

(56) References Cited

U.S. PATENT DOCUMENTS 2,697,811 A   12/1954  Deming
2,731,609 A    1/1956  Sobell
(Continued)

FOREIGN PATENT DOCUMENTS

CN   201242082   5/2009
CN   201731316   2/2011
(Continued)

OTHER PUBLICATIONS

"3M Thermally Conductive Adhesive Transfer Tapes—Technical Data," Electronic Adhesives and Specialties Department, Engineered Adhesives Division, Sep. 2002, (pp. 1-6).
(Continued)

*Primary Examiner* — Kiley S Stoner
(74) *Attorney, Agent, or Firm* — Pauly, DeVries Smith & Deffner LLC

(57) ABSTRACT

Embodiments of the invention include flexible circuit board interconnections and methods regarding the same. In an embodiment, the invention includes a method of connecting a plurality of flexible circuit boards together comprising the steps applying a solder composition between an upper surface of a first flexible circuit board and a lower surface of a second flexible circuit board; holding the upper surface of the first flexible circuit board and the lower surface of the second flexible circuit board together; and reflowing the solder composition with a heat source to bond the first flexible circuit board and the second flexible circuit board together to form a flexible circuit board strip having a length longer than either of the first flexible circuit board or second flexible circuit board separately. In an embodiment the invention includes a circuit board clamp for holding flexible circuit boards together, the clamp including a u-shaped fastener; a spring tension arm connected to the u-shaped fastener; and an attachment mechanism connected to the
(Continued)

spring tension arm. Other embodiments are also included herein.

12 Claims, 25 Drawing Sheets

Related U.S. Application Data continuation of application No. 14/506,251, filed on Oct. 3, 2014, now Pat. No. 9,736,946, which is a continuation of application No. 13/158,149, filed on Jun. 10, 2011, now Pat. No. 8,851,356, which is a continuation-in-part of application No. 12/372,499, filed on Feb. 17, 2009, now Pat. No. 7,980,863, and a continuation-in-part of application No. 12/406,761, filed on Mar. 18, 2009, now Pat. No. 8,007,286.

(60) Provisional application No. 61/028,779, filed on Feb. 14, 2008, provisional application No. 61/037,595, filed on Mar. 18, 2008, provisional application No. 61/043,006, filed on Apr. 7, 2008.

(51) Int. Cl.
| | | |
|---|---|---|
| *H05K 3/36* | (2006.01) | |
| *H01R 4/02* | (2006.01) | |
| *H05K 1/02* | (2006.01) | |
| *H05K 1/11* | (2006.01) | |
| *H05K 1/14* | (2006.01) | |
| *H01R 12/61* | (2011.01) | |
| *H05K 1/18* | (2006.01) | |
| *F21Y 115/10* | (2016.01) | |
| *F21Y 107/30* | (2016.01) | |

(52) U.S. Cl.
CPC ........... *B23K 37/0435* (2013.01); *H01R 4/02* (2013.01); *H01R 12/61* (2013.01); *H05K 1/0269* (2013.01); *H05K 1/118* (2013.01); *H05K 1/144* (2013.01); *H05K 1/147* (2013.01); *H05K 1/189* (2013.01); *F21Y 2107/30* (2016.08); *F21Y 2115/10* (2016.08); *H05K 2201/0108* (2013.01); *H05K 2201/0311* (2013.01); *H05K 2201/058* (2013.01); *H05K 2201/09481* (2013.01); *H05K 2201/09918* (2013.01); *H05K 2201/10106* (2013.01); *H05K 2203/0195* (2013.01); *H05K 2203/0228* (2013.01); *H05K 2203/043* (2013.01); *H05K 2203/16* (2013.01)

(58) Field of Classification Search
CPC ... H05K 2201/0108; H05K 2203/0195; H05K 2203/043; H05K 2203/16; H05K 2201/0311; H05K 2201/058; H05K 2201/09481; H05K 2201/09918; H05K 2201/10106; H05K 2203/0228; B23K 37/0435; B23K 1/0016; B23K 37/04; H01R 12/61; H01R 4/02; F21Y 2115/10; F21Y 2107/30
See application file for complete search history.

(56) References Cited

U.S. PATENT DOCUMENTS

| | | | |
|---|---|---|---|
| 3,028,573 | A | 4/1962 | Stoehr |
| 3,086,189 | A | 4/1963 | Robbins |
| 3,270,251 | A | 8/1966 | Evans |
| 3,401,369 | A | 9/1968 | Plamateer et al. |
| 3,499,098 | A | 3/1970 | Mcgahey et al. |
| 3,585,403 | A | 6/1971 | Gribbons |
| 3,628,999 | A | 12/1971 | Schneble, Jr. et al. |
| 3,640,519 | A | 2/1972 | William et al. |
| 3,745,091 | A | 7/1973 | Mccormick |
| 3,896,076 | A * | 7/1975 | Watanabe ............. H05K 3/386 |
| | | | 523/440 |
| 3,932,689 | A * | 1/1976 | Watanabe ............. C08L 57/10 |
| | | | 428/418 |
| 3,962,520 | A * | 6/1976 | Watanabe ............. C09J 175/06 |
| | | | 428/414 |
| 4,017,847 | A | 4/1977 | Burford et al. |
| 4,150,421 | A | 4/1979 | Nishihara et al. |
| 4,173,035 | A | 10/1979 | Hoyt |
| 4,249,303 | A | 2/1981 | Greenwood et al. |
| 4,250,536 | A | 2/1981 | Barringer et al. |
| 4,285,780 | A | 8/1981 | Schachter |
| 4,388,136 | A | 6/1983 | Jacobus et al. |
| 4,515,304 | A | 5/1985 | Berger |
| 4,521,969 | A | 6/1985 | Greenwood |
| 4,526,432 | A | 7/1985 | Cronin et al. |
| 4,533,188 | A | 8/1985 | Miniet |
| 4,618,194 | A | 10/1986 | Kwilos |
| 4,685,210 | A | 8/1987 | King et al. |
| 4,761,881 | A | 8/1988 | Bora et al. |
| 4,795,079 | A | 1/1989 | Yamada |
| 4,815,981 | A | 3/1989 | Mizuno |
| 4,842,184 | A | 6/1989 | Miller, Jr. |
| 4,871,315 | A | 10/1989 | Noschese |
| 4,950,527 | A | 8/1990 | Yamada |
| 4,991,290 | A | 2/1991 | Mackay |
| 5,001,605 | A | 3/1991 | Savagian et al. |
| 5,041,003 | A | 8/1991 | Smith et al. |
| 5,093,985 | A | 3/1992 | Houldsworth et al. |
| 5,103,382 | A | 4/1992 | Kondo et al. |
| 5,155,904 | A | 10/1992 | Majd |
| 5,176,255 | A | 1/1993 | Seidler |
| 5,224,023 | A | 6/1993 | Smith et al. |
| 5,254,910 | A | 10/1993 | Yang |
| 5,375,044 | A | 12/1994 | Guritz |
| 5,404,044 | A | 4/1995 | Booth et al. |
| 5,440,454 | A | 8/1995 | Hashimoto et al. |
| 5,478,008 | A | 12/1995 | Takahashi |
| 5,511,719 | A | 4/1996 | Miyake et al. |
| 5,523,695 | A | 6/1996 | Lin |
| 5,563,777 | A | 10/1996 | Miki et al. |
| 5,575,554 | A | 11/1996 | Guritz |
| 5,579,574 | A * | 12/1996 | Colleran ............. H05K 3/0097 |
| | | | 29/840 |
| 5,585,675 | A | 12/1996 | Knopf |
| 5,598,627 | A * | 2/1997 | Saka ..................... H01R 12/62 |
| | | | 174/72 A |
| 5,724,446 | A | 3/1998 | Liu et al. |
| 5,887,158 | A | 3/1999 | Sample et al. |
| 5,917,149 | A | 6/1999 | Barcley et al. |
| 5,920,465 | A | 7/1999 | Tanaka |
| 5,984,691 | A | 11/1999 | Brodsky et al. |
| 6,018,326 | A * | 1/2000 | Rudisill ................ H01Q 1/084 |
| | | | 343/895 |
| 6,040,624 | A | 3/2000 | Chambers et al. |
| 6,065,666 | A | 5/2000 | Backlund |
| 6,089,442 | A | 7/2000 | Ouchi et al. |
| 6,095,405 | A | 8/2000 | Kim et al. |
| 6,100,475 | A | 8/2000 | Degani et al. |
| 6,113,248 | A | 9/2000 | Mistopoulos et al. |
| 6,130,823 | A | 10/2000 | Lauder et al. |
| 6,137,816 | A | 10/2000 | Kinbara |
| 6,147,724 | A * | 11/2000 | Yoshii ............... G02F 1/133602 |
| | | | 349/62 |
| 6,199,273 | B1 | 3/2001 | Kubo et al. |
| 6,226,862 | B1 | 5/2001 | Neuman |
| 6,239,716 | B1 | 5/2001 | Pross et al. |
| 6,299,337 | B1 | 10/2001 | Bachl et al. |
| 6,299,469 | B1 | 10/2001 | Glovatsky et al. |
| 6,310,445 | B1 | 10/2001 | Kashaninejad |
| 6,319,019 | B1 * | 11/2001 | Kwon ................. G02F 1/13452 |
| | | | 439/67 |
| 6,372,997 | B1 | 4/2002 | Hill et al. |
| 6,384,339 | B1 | 5/2002 | Neuman |
| 6,428,189 | B1 | 8/2002 | Hochstein |

(56) References Cited

U.S. PATENT DOCUMENTS

| | | |
|---|---|---|
| 6,429,383 B1 | 8/2002 | Sprietsma et al. |
| 6,443,179 B1* | 9/2002 | Benavides ............... F15C 5/00 |
| | | 137/454.2 |
| 6,448,661 B1 | 9/2002 | Kim et al. |
| 6,449,836 B1 | 9/2002 | Miyake et al. |
| 6,465,084 B1 | 10/2002 | Curcio et al. |
| 6,481,874 B2 | 11/2002 | Petroski |
| 6,517,218 B2 | 2/2003 | Hochstein |
| 6,548,895 B1* | 4/2003 | Benavides ............ H01L 23/473 |
| | | 257/712 |
| 6,555,756 B2 | 4/2003 | Nakamura et al. |
| 6,574,113 B2* | 6/2003 | Armezzani ....... H01L 23/49816 |
| | | 174/260 |
| 6,578,986 B2 | 6/2003 | Swaris et al. |
| 6,580,228 B1 | 6/2003 | Chen et al. |
| 6,589,594 B1 | 7/2003 | Hembree |
| 6,601,292 B2 | 8/2003 | Li et al. |
| 6,651,322 B1 | 11/2003 | Currie |
| 6,657,297 B1 | 12/2003 | Jewram et al. |
| 6,729,888 B2 | 5/2004 | Imaeda |
| 6,746,885 B2 | 6/2004 | Cao |
| 6,784,027 B2 | 8/2004 | Streubel |
| 6,833,526 B2 | 12/2004 | Sinkunas et al. |
| 6,846,094 B2 | 1/2005 | Luk |
| 6,851,831 B2 | 2/2005 | Karlicek, Jr. et al. |
| 6,884,313 B2 | 4/2005 | Lee et al. |
| 6,897,622 B2 | 5/2005 | Lister |
| 6,898,084 B2 | 5/2005 | Misra |
| 6,902,099 B2 | 6/2005 | Motonishi et al. |
| 6,919,529 B2 | 7/2005 | Franzen et al. |
| 6,936,855 B1 | 8/2005 | Harrah |
| 6,963,175 B2 | 11/2005 | Archenhold et al. |
| 6,966,674 B2 | 11/2005 | Tsai |
| 6,991,473 B1 | 1/2006 | Balcome et al. |
| 6,996,674 B2 | 2/2006 | Chiu et al. |
| 7,023,147 B2 | 4/2006 | Colby et al. |
| 7,037,114 B1 | 5/2006 | Eiger et al. |
| 7,086,756 B2 | 8/2006 | Maxik |
| 7,086,767 B2 | 8/2006 | Sidwell et al. |
| 7,114,831 B2 | 10/2006 | Popovich et al. |
| 7,114,837 B2 | 10/2006 | Yagi et al. |
| 7,149,097 B1 | 12/2006 | Shteynberg et al. |
| 7,199,309 B2 | 4/2007 | Chamberlin et al. |
| 7,204,615 B2 | 4/2007 | Arik et al. |
| 7,210,818 B2 | 5/2007 | Luk et al. |
| 7,248,245 B2 | 7/2007 | Adachi et al. |
| 7,253,449 B2 | 8/2007 | Wu |
| 7,256,554 B2 | 8/2007 | Lys |
| 7,262,438 B2 | 8/2007 | Mok et al. |
| 7,263,769 B2 | 9/2007 | Morimoto et al. |
| 7,276,861 B1 | 10/2007 | Shteynberg et al. |
| 7,284,882 B2 | 10/2007 | Burkholder |
| 7,325,955 B2 | 2/2008 | Lucas et al. |
| 7,331,796 B2 | 2/2008 | Hougham et al. |
| 7,341,476 B2 | 3/2008 | Soeta |
| 7,344,279 B2 | 3/2008 | Mueller et al. |
| 7,377,669 B2 | 5/2008 | Farmer et al. |
| 7,377,787 B1 | 5/2008 | Eriksson |
| 7,394,027 B2 | 7/2008 | Kaluzni et al. |
| 7,397,068 B2 | 7/2008 | Park et al. |
| 7,448,923 B2 | 11/2008 | Uka |
| 7,459,864 B2 | 12/2008 | Lys |
| 7,497,695 B2 | 3/2009 | Uchida et al. |
| 7,502,846 B2 | 3/2009 | Mccall |
| 7,514,880 B2 | 4/2009 | Huang et al. |
| 7,543,961 B2 | 6/2009 | Arik et al. |
| 7,547,124 B2 | 6/2009 | Chang et al. |
| 7,550,930 B2 | 6/2009 | Cristoni et al. |
| 7,553,051 B2 | 6/2009 | Brass et al. |
| 7,556,405 B2 | 7/2009 | Kingsford et al. |
| 7,556,406 B2 | 7/2009 | Petroski et al. |
| 7,573,210 B2 | 8/2009 | Ashdown et al. |
| 7,583,035 B2 | 9/2009 | Shteynerg et al. |
| 7,598,685 B1 | 10/2009 | Shteynberg et al. |
| 7,656,103 B2 | 2/2010 | Shteynberg et al. |
| 7,665,999 B2 | 2/2010 | Hougham et al. |
| 7,696,628 B2 | 4/2010 | Ikeuchi et al. |
| 7,710,047 B2 | 5/2010 | Shteynberg et al. |
| 7,710,050 B2 | 5/2010 | Preston et al. |
| 7,777,236 B2 | 8/2010 | Pachler |
| 7,800,315 B2 | 9/2010 | Shteynberg et al. |
| 7,806,572 B2 | 10/2010 | Mcfadden et al. |
| 7,810,955 B2 | 10/2010 | Stimac et al. |
| 7,852,009 B2 | 12/2010 | Coleman et al. |
| 7,852,300 B2 | 12/2010 | Shteynberg et al. |
| 7,880,400 B2 | 2/2011 | Zhou et al. |
| 7,888,881 B2 | 2/2011 | Shteynberg et al. |
| 7,902,769 B2 | 3/2011 | Shteynberg et al. |
| 7,902,771 B2 | 3/2011 | Shteynbert et al. |
| 7,943,940 B2 | 5/2011 | Boonekamp et al. |
| 7,952,294 B2 | 5/2011 | Shteynberg et al. |
| 7,956,554 B2 | 6/2011 | Shteynberg et al. |
| 7,977,698 B2 | 7/2011 | Ling et al. |
| 7,980,863 B1 | 7/2011 | Holec et al. |
| 8,004,211 B2 | 8/2011 | Van Erp |
| 8,007,286 B1 | 8/2011 | Holec et al. |
| 8,011,806 B2 | 9/2011 | Shiraishi et al. |
| 8,038,329 B2 | 10/2011 | Takahasi et al. |
| 8,045,312 B2 | 10/2011 | Shrier |
| 8,061,886 B1 | 11/2011 | Kraus, Jr. et al. |
| 8,065,794 B2 | 11/2011 | En et al. |
| 8,067,896 B2 | 11/2011 | Shteynberg et al. |
| 8,075,477 B2 | 12/2011 | Nakamura et al. |
| 8,115,370 B2 | 2/2012 | Huang |
| 8,124,429 B2 | 2/2012 | Norman |
| 8,137,113 B2 | 3/2012 | Ouchi et al. |
| 8,143,631 B2 | 3/2012 | Crandell et al. |
| 8,162,200 B2 | 4/2012 | Buchwalter et al. |
| 8,166,650 B2 | 5/2012 | Thomas |
| 8,210,422 B2 | 7/2012 | Zadesky |
| 8,210,424 B2 | 7/2012 | Weibezahn |
| 8,227,962 B1 | 7/2012 | Su |
| 8,232,735 B2 | 7/2012 | Shteynberg et al. |
| 8,242,704 B2 | 8/2012 | Lethellier |
| 8,253,349 B2 | 8/2012 | Shteynberg et al. |
| 8,253,666 B2 | 8/2012 | Shteynberg et al. |
| 8,264,169 B2 | 9/2012 | Shteynberg et al. |
| 8,264,448 B2 | 9/2012 | Shteynberg et al. |
| 8,410,720 B2 | 4/2013 | Holec et al. |
| 8,500,456 B1 | 8/2013 | Holec et al. |
| 8,525,193 B2 | 9/2013 | Crandell et al. |
| 8,618,669 B2 | 12/2013 | Furuta |
| 8,710,764 B2 | 4/2014 | Holec et al. |
| 8,851,356 B1 | 10/2014 | Holec et al. |
| 8,947,389 B1 | 2/2015 | Shin et al. |
| 8,968,006 B1 | 3/2015 | Holec et al. |
| 9,341,355 B2 | 5/2016 | Crandell et al. |
| 9,357,639 B2 | 5/2016 | Holec et al. |
| 9,474,154 B2 | 10/2016 | Johansson et al. |
| 9,736,946 B2 | 8/2017 | Holec et al. |
| 10,334,735 B2 | 6/2019 | Holec et al. |
| 10,499,511 B2 | 12/2019 | Holec et al. |
| 10,849,200 B2 | 11/2020 | Holec et al. |
| 10,905,004 B2 | 1/2021 | Holec et al. |
| 2001/0000906 A1 | 5/2001 | Yoshikawa et al. |
| 2001/0004085 A1 | 6/2001 | Gueissaz |
| 2002/0014518 A1 | 2/2002 | Totani et al. |
| 2002/0043402 A1 | 4/2002 | Juskey et al. |
| 2002/0094705 A1 | 7/2002 | Driscoll et al. |
| 2002/0105373 A1 | 8/2002 | Sudo |
| 2002/0135993 A1* | 9/2002 | Ueyama ................ H05K 1/028 |
| | | 361/814 |
| 2002/0148636 A1 | 10/2002 | Belke et al. |
| 2002/0179331 A1 | 12/2002 | Brodsky et al. |
| 2003/0040166 A1 | 2/2003 | Moshayedi |
| 2003/0052594 A1 | 3/2003 | Matsui et al. |
| 2003/0053279 A1* | 3/2003 | Meehleder ............ H05K 1/189 |
| | | 361/160 |
| 2003/0062195 A1 | 4/2003 | Arrigotti et al. |
| 2003/0072153 A1 | 4/2003 | Matsui et al. |
| 2003/0079341 A1 | 5/2003 | Miyake et al. |
| 2003/0092293 A1 | 5/2003 | Ohtsuki et al. |
| 2003/0094305 A1 | 5/2003 | Ueda |
| 2003/0098339 A1 | 5/2003 | Totani et al. |

(56) References Cited

U.S. PATENT DOCUMENTS

| | | |
|---|---|---|
| 2003/0137839 A1 | 7/2003 | Lin |
| 2003/0146018 A1 | 8/2003 | Sinkunas et al. |
| 2003/0193789 A1 | 10/2003 | Karlicek, Jr. |
| 2003/0193801 A1 | 10/2003 | Lin et al. |
| 2003/0199122 A1 | 10/2003 | Wada et al. |
| 2003/0223210 A1 | 12/2003 | Chin |
| 2004/0007981 A1 | 1/2004 | Shibata et al. |
| 2004/0055784 A1 | 3/2004 | Joshi et al. |
| 2004/0060969 A1 | 4/2004 | Imai et al. |
| 2004/0079193 A1 | 4/2004 | Kokubo et al. |
| 2004/0087190 A1 | 5/2004 | Miyazawa et al. |
| 2004/0090403 A1 | 5/2004 | Huang |
| 2004/0239243 A1 | 12/2004 | Roberts et al. |
| 2004/0264148 A1 | 12/2004 | Burdick, Jr. et al. |
| 2005/0056923 A1 | 3/2005 | Moshayedi |
| 2005/0067472 A1 | 3/2005 | Ohtsuki et al. |
| 2005/0133800 A1 | 6/2005 | Park et al. |
| 2005/0207156 A1 | 9/2005 | Wang et al. |
| 2005/0239300 A1 | 10/2005 | Yasumura et al. |
| 2005/0242160 A1 | 11/2005 | Nippa et al. |
| 2005/0272276 A1 | 12/2005 | Ooyabu |
| 2006/0000877 A1 | 1/2006 | Wang et al. |
| 2006/0022051 A1 | 2/2006 | Patel et al. |
| 2006/0025023 A1 | 2/2006 | Ikeda et al. |
| 2006/0038542 A1 | 2/2006 | Park et al. |
| 2006/0128174 A1 | 6/2006 | Jang et al. |
| 2006/0181878 A1 | 8/2006 | Burkholder |
| 2006/0220051 A1 | 10/2006 | Fung et al. |
| 2006/0221609 A1 | 10/2006 | Ryan |
| 2006/0245174 A1 | 11/2006 | Ashdown et al. |
| 2006/0284640 A1 | 12/2006 | Wang et al. |
| 2007/0015417 A1 | 1/2007 | Caveney et al. |
| 2007/0054517 A1 | 3/2007 | Hidaka et al. |
| 2007/0064054 A1* | 3/2007 | Hayden ............... H05K 3/0097 347/59 |
| 2007/0077688 A1* | 4/2007 | Hsu .................... H05K 3/0064 438/118 |
| 2007/0141868 A1* | 6/2007 | Park ..................... H05K 1/148 439/74 |
| 2007/0157464 A1 | 7/2007 | Jeon et al. |
| 2007/0171145 A1 | 7/2007 | Coleman et al. |
| 2007/0184675 A1 | 8/2007 | Ishikawa et al. |
| 2007/0194428 A1 | 8/2007 | Sato et al. |
| 2007/0210722 A1 | 9/2007 | Konno et al. |
| 2007/0216987 A1 | 9/2007 | Hagood et al. |
| 2007/0217202 A1 | 9/2007 | Sato |
| 2007/0252268 A1 | 11/2007 | Chew et al. |
| 2007/0257623 A1 | 11/2007 | Johnson et al. |
| 2008/0031640 A1 | 2/2008 | Fukui |
| 2008/0045077 A1 | 2/2008 | Chou et al. |
| 2008/0062661 A1* | 3/2008 | Choi .................... H05K 1/147 361/752 |
| 2008/0138576 A1 | 6/2008 | Nozu et al. |
| 2008/0143379 A1 | 6/2008 | Norman |
| 2008/0144322 A1 | 6/2008 | Norfidathul et al. |
| 2008/0160795 A1 | 7/2008 | Chen et al. |
| 2008/0191642 A1 | 8/2008 | Slot et al. |
| 2008/0232047 A1 | 9/2008 | Yamada et al. |
| 2008/0249363 A1 | 10/2008 | Nakamura et al. |
| 2008/0254653 A1 | 10/2008 | Uka |
| 2008/0310141 A1 | 12/2008 | Mezouari |
| 2008/0311771 A1 | 12/2008 | Cho |
| 2009/0029570 A1 | 1/2009 | Ikeuchi et al. |
| 2009/0079357 A1 | 3/2009 | Shteynberg et al. |
| 2009/0103302 A1 | 4/2009 | Lin et al. |
| 2009/0117373 A1 | 5/2009 | Wisniewski et al. |
| 2009/0140415 A1 | 6/2009 | Furuta |
| 2009/0191725 A1 | 7/2009 | Vogt et al. |
| 2009/0205200 A1 | 8/2009 | Rosenblatt et al. |
| 2009/0226656 A1 | 9/2009 | Crandell et al. |
| 2009/0230883 A1 | 9/2009 | Haug |
| 2009/0251068 A1 | 10/2009 | Holec et al. |
| 2009/0301544 A1 | 12/2009 | Minelli |
| 2009/0308652 A1 | 12/2009 | Shih |
| 2010/0008090 A1 | 1/2010 | Li et al. |
| 2010/0012271 A1* | 1/2010 | Krawinkel ............... C09J 7/35 156/330 |
| 2010/0018763 A1 | 1/2010 | Barry |
| 2010/0026208 A1 | 2/2010 | Shteynberg et al. |
| 2010/0059254 A1 | 3/2010 | Sugiyama et al. |
| 2010/0093190 A1 | 4/2010 | Miwa et al. |
| 2010/0109536 A1 | 5/2010 | Jung et al. |
| 2010/0110682 A1 | 5/2010 | Jung et al. |
| 2010/0167561 A1 | 7/2010 | Brown et al. |
| 2010/0187005 A1 | 7/2010 | Yeh |
| 2010/0213859 A1 | 8/2010 | Shteynberg et al. |
| 2010/0220046 A1 | 9/2010 | Plötz et al. |
| 2010/0308738 A1 | 12/2010 | Shteynberg et al. |
| 2010/0308739 A1 | 12/2010 | Shteynberg et al. |
| 2011/0024180 A1 | 2/2011 | Ko |
| 2011/0051448 A1 | 3/2011 | Owada |
| 2011/0096545 A1 | 4/2011 | Chang |
| 2011/0115411 A1 | 5/2011 | Shteynberg et al. |
| 2011/0121754 A1 | 5/2011 | Shteynberg et al. |
| 2011/0157897 A1 | 6/2011 | Liao et al. |
| 2011/0172658 A1* | 7/2011 | Gelbart ............... A61B 18/1492 606/41 |
| 2011/0177700 A1 | 7/2011 | Jia et al. |
| 2011/0230067 A1 | 9/2011 | Champion et al. |
| 2011/0309759 A1 | 12/2011 | Shteynberg et al. |
| 2011/0311789 A1 | 12/2011 | Loy et al. |
| 2012/0002438 A1 | 1/2012 | Gourlay |
| 2012/0014108 A1 | 1/2012 | Greenfield et al. |
| 2012/0068622 A1 | 3/2012 | Ward |
| 2012/0081009 A1 | 4/2012 | Shteynberg et al. |
| 2012/0081018 A1 | 4/2012 | Shteynberg et al. |
| 2012/0097784 A1 | 4/2012 | Liao et al. |
| 2012/0162990 A1 | 6/2012 | Crandell et al. |
| 2012/0188771 A1 | 7/2012 | Kraus et al. |
| 2012/0195024 A1 | 8/2012 | Kawaguchi et al. |
| 2012/0281411 A1 | 11/2012 | Kajiya et al. |
| 2013/0070452 A1 | 3/2013 | Urano et al. |
| 2013/0128582 A1 | 5/2013 | Holec et al. |
| 2013/0320523 A1 | 12/2013 | Lee et al. |
| 2014/0015414 A1 | 1/2014 | Holec et al. |
| 2014/0168982 A1 | 6/2014 | Crandell et al. |
| 2014/0197743 A1 | 7/2014 | Holec et al. |
| 2015/0173183 A1 | 6/2015 | Holec et al. |
| 2015/0189765 A1 | 7/2015 | Holec et al. |
| 2017/0055346 A1 | 2/2017 | Holec et al. |
| 2018/0063968 A1 | 3/2018 | Holec et al. |
| 2020/0053875 A1 | 2/2020 | Holec et al. |

FOREIGN PATENT DOCUMENTS

| | | | |
|---|---|---|---|
| CN | 102788284 | 11/2012 | |
| DE | 102009055859 | 6/2011 | |
| EP | 0961351 | 12/1999 | |
| EP | 1814369 A1 * | 8/2007 | .......... H05K 3/0097 |
| EP | 2505044 | 10/2012 | |
| EP | 2888517 | 7/2015 | |
| GB | 2483942 | 3/2012 | |
| JP | 59186388 | 10/1984 | |
| JP | 01319993 | 12/1989 | |
| JP | 05090726 | 4/1993 | |
| JP | 05090748 | 4/1993 | |
| JP | 05090749 | 4/1993 | |
| JP | 05299565 A * | 11/1993 | |
| JP | 11297388 A * | 10/1999 | |
| JP | 2002043737 | 2/2002 | |
| JP | 2002117707 | 4/2002 | |
| JP | 2002341317 A * | 11/2002 | |
| JP | 2005285960 | 10/2005 | |
| JP | 2006000227 | 3/2006 | |
| JP | 2007208200 | 8/2007 | |
| JP | 2008159908 A * | 7/2008 | |
| JP | 2010153549 | 7/2010 | |
| JP | 2011169791 | 9/2011 | |
| KR | 20070025033 A * | 3/2007 | |
| WO | 2007076819 | 7/2007 | |
| WO | 2011064107 | 6/2011 | |
| WO | 2011077778 | 6/2011 | |
| WO | 2011136236 | 11/2011 | |
| WO | 2014031567 | 2/2014 | |

(56) References Cited

FOREIGN PATENT DOCUMENTS

OTHER PUBLICATIONS

"Communication Pursuant to Rules 161(1) and 162 EPC," for European Patent Application No. 13763341.8, dated Apr. 7, 2015 (2 pages).
"Custom LUXEON Design Guide," Application Brief AB13, Mar. 2006 (14 pages).
"Derwent-Acc-No. 1984-298428," corresponds to JP-59-186338A (1984).
"Derwent-Acc-No. 2010-J09039," corresponds to JP-201 0-153549A (1984).
"DRAGONtape DT6 Data Sheet," Sep. 2007 (4 pages).
"DRAGONtape Product Information Bulletin," OSRAM SYLVANIA, 2007, 2 pages.
"DRAGONtape Product Information Bulletin," OSRAM, Nov. 2005 (4 pages).
"File History," File History for Related U.S. Appl. No. 12/406,761 downloaded Apr. 21, 2015, 260 pages.
"File History," for U.S. Appl. No. 12/372,499, filed Feb. 17, 2009 to Dec. 19, 2011 (321 pages).
"File History," for U.S. Appl. No. 12/406,761, filed Mar. 18, 2009 to Aug. 11, 2011 (257 pages).
"File History," for U.S. Appl. No. 13/592,090, filed Aug. 22, 2012 to Jun. 5, 2019 (511 pages).
"File History," for U.S. Appl. No. 14/506,251, filed Oct. 3, 2014 to Jul. 27, 2017 (307 pages).
"File History," for U.S. Appl. No. 15/165,768, filed May 26, 2016 to Sep. 16, 2020 (531 pages).
"File History," for U.S. Appl. No. 15/675,938, filed Aug. 14, 2017 to Nov. 13, 2019 (290 pages).
"Final Office Action," for U.S. Appl. No. 13/158,149, dated Mar. 6, 2013 (11 pages).
"Final Office Action," For U.S. Appl. No. 14/015,679, dated Dec. 16, 2014 (19 pages).
"Final Office Action," dated Jul. 12, 2010 in co-pending U.S. Appl. No. 12/406,761, entitled "Printed Circuit Board Interconnect Construction." (6 pages).
"Final Office Action," dated Aug. 7, 2012 in U.S. Appl. No. 13/190,639, "Interconnectable Circuit Boards," (25 pages).
Fjelstad, Joseph "Flexible Circuit Technology, Third Edition," Br Publishing, Incorporated, 2007 (237 pages).
"Flex Connectors User's Guide," OSRAM Sylvania, Oct. 2007 (6 pages).
"Fr406 High Performance Epoxy Laminate and Prepreg." Isola, 2006 (2 pages).
"Fr406: High Performance Epoxy Lamimate and Prepreg," http://www.isola-group.com/en/products/name/details.shtl?13, Mar. 2008 (1 page).
"High Performance Epoxy Laminate and Prepreg," Isola, Mar. 2007 (3 pages).
"International Preliminary Report on Patentability," for PCT/US2013/055658, dated Mar. 5, 2015 (7 pages).
"International Search Report and Written Opinion," for PCT/US2013/055658, dated Jan. 15, 2014 (10 pages).
"Ipc-4101B: Specification for Base Materials for Rigid and Multilayer Printed Boards," Mar. 2006 (109 pages).
"Kapton Polyimide Film," DuPont Electronics, http://www2.dupont.com/Kapton/en_US/index.html, Feb. 2008 (9 pages).
"Linear Products," OSRAM SYLVANIA, http://www.sylvania.com/BusinessProducts/Innovations/LED+Systems/Linear/, 2004 (1 page).
"LINEARlight Flex & Power Flex LED Systems," OSRAM SYLVANIA, http://www/sylvania.com/AboutUS/Pressxpress/Innovation/LightingNews(US)/2007/USLi, Sep. 2007 (3 pages).
"LINEARlight Flex Topled, Flexible LED Strip," Osran Sylvania LED Systems Specification Guide (2007), p. 100.
"LINEARlight Power Flex, Flexible LED Strip," Osran Sylvania LED Systems Specification Guide, 2007, p. 96.

"LINEARlight Power Flex: Flexible High Light Output LED Modules," OSRAM SYLVANIA, Apr. 2008.
"LINEARlight Power Flex: LM10P Data Sheet," May 2007 (4 pages).
Murray, Cameron T. et al., "3M Thermally Conductive Tapes," 3M Electronic Markets Materials Divsion, Mar. 2004 (39 pages).
"Nichia Application Note," Oct. 31, 2003 (p. 5).
"Non Final Office Action," dated Mar. 5, 2012 in co pending U.S. Appl. No. 13/190,639, "Printed Circuit Board Interconnect Construction" (12 pages).
"Non-Final Office Action," for U.S. Appl. No. 13/158,149, dated Jul. 3, 2013 (32 pages).
"Non-Final Office Action," for U.S. Appl. No. 13/944,610, dated Mar. 18, 2014 (20 pages).
"Non-Final Office Action," for U.S. Appl. No. 14/015,679, dated Apr. 1, 2014 (7 pages).
"Non-Final Office Action," for U.S. Appl. No. 14/015,679, dated Jun. 19, 2015 (9 pages).
"Non-Final Office Action," dated Apr. 1, 2010 in co-pending U.S. Appl. No. 12/406,761, entitled "Printed Circuit Board Interconnect Construction" (5 pages).
"Non-Final Office Action," dated Oct. 1, 2012 in U.S. Appl. No. 13/411,322, "Layered Structure For Use With High Power Light Emitting Diode Systems," (18 pages).
"Non-Final Office Action," dated Aug. 11, 2012 in co-pending U.S. Appl. No. 13/158,149, "Flexible Circuit Board Interconnection and Methods," (27 pages).
"Notice of Allowance," For U.S. Appl. No. 13/944,610, dated Oct. 31, 2014 (11 pages).
"Notice of Allowance," for U.S. Appl. No. 13/158,149, dated Feb. 11, 2014 (12 pages).
"Notice of Allowance," for U.S. Appl. No. 13/158,149, dated Jun. 6, 2014 (12 pages).
"Notice of Allowance," U.S. Appl. No. 14/015,679 dated Jan. 13, 2016 (10 pages).
"Notice of Allowance," for U.S. Appl. No. 14/015,679 dated Oct. 26, 2015 (10 pages).
"Notice of Allowance," for U.S. Appl. No. 14/633,726, dated Jan. 25, 2016 (35 pages).
"Notice of Allowance," for U.S. Appl. No. 13/190,639, dated Apr. 4, 2013, 12 pages.
"Notice of Allowance," for U.S. Appl. No. 13/411,322, dated May 10, 2013, 29 pages.
"Notice of Allowance," dated Nov. 16, 2011 in co-pending U.S. Appl. No. 12/043,424, "Layered Structure For Use With High Power Light Emitting Diode Systems," (9 pages).
"Notice of Allowance," dated Apr. 14, 2011 in co-pending U.S. Appl. No. 12/406,761, "Printed Circuit board Interconnect Construction," (10 pages).
"Nud4001—High Current LED Driver," Semiconductor Components Industries, LLC http://onsemi.com, Jun. 2006 (8 pages).
O'Malley, Kieran "Using the NUD4001 to Drive High Current LEDs," http;//onsemi.com, Feb. 2005 (4 pages).
"Product Information Bulletin HF2STick XB: Hi-Flux 2nd Generation Module," OSRAM SYLVANIA, Jan. 2008 (4 pages).
"Responsive Non-Final Office Action," for U.S. Appl. No. 14/015,679, dated Jun. 19, 2015 and filed with the USPTO Sep. 18, 2015 (5 pages).
"Response to Final Office Action," for U.S. Appl. No. 12/406,761 dated Oct. 12, 2010 (10 pages).
"Response to Final Office Action," for U.S. Appl. No. 13/158,149, dated Jun. 6, 2013 (10 pages).
"Response to Final Office Action," for U.S. Appl. No. 14/015,679, dated Dec. 16, 2014 and filed with the USPTO May 15, 2015 (5 pages).
"Response to Final Office Action," dated Aug. 7, 2012, in co-pending U.S. Appl. No. 13/190,639, file with the USPTO Nov. 7, 2012, 14 pages.
"Response to Final Office Action," for U.S. Appl. No. 13/158,149 dated Feb. 21, 2013 (12 pages).
"Response to Final Office Action," for U.S. Appl. No. 13/190,639 dated Jul. 26, 2012 (17 pages).

(56) References Cited

OTHER PUBLICATIONS

"Response to Final Office Action," for U.S. Appl. No. 13/411,322, dated Jan. 3, 2013 (6 pages).

"Response to Final Office Action," for U.S. Appl. No. 13/158,149, dated Jan. 2, 2014 (14 pages).

"Response to Final Office Action," for U.S. Appl. No. 13/944,610, dated Mar. 18, 2014 and filed with the USPTO Sep. 18, 2014 (9 pages).

"Response to Final Office Action," for U.S. Appl. No. 14/015,679, dated Apr. 1, 2014 and filed with the USPTO Oct. 1, 2014 (6 pages).

"Restriction Requirement," U.S. Appl. No. 13/158,149 dated Jun. 29, 2012 (6 pages).

"Specifications for Nichia Chip Type Warm White LED, Model: NS6L083T," Nichia Corporation, Jun. 2006, 3 pages.

"Specifications for Nichia Chip Type White LED Model: NS6W083AT," Nichia Corporation, No. STSE-CC7134, <Cat.No.070706>, date unkown (14 pages).

"TechniMask ISR 1000 Series," Technic, Inc., http://www.technic.com/pwb/solderisr1000.htm, 2003 (1 page).

"Thermal Mangagement for LED Applications Solutions Guide," The Bergquist Company, date unknown (6 pages).

"T-lam System—Thermall Conductive Circuit Board Materials," http://www.lairdtech.com/pages/products/T-Lam-Systems.asp, Feb. 2008 (7 pages).

"Final Office Action," for U.S. Appl. No. 16/450,366, dated Apr. 23, 2021 (12 pages).

"Non-Final Office Action," for U.S. Appl. No. 16/450,366, dated Dec. 9, 2020 (50 pages).

"Notice of Allowance," for U.S. Appl. No. 16/450,366 dated Oct. 20, 2021 (14 pages).

"Response to Final Office Action," for U.S. Appl. No. 16/450,366, filed Jul. 23, 2021 (15 pages).

"Response to Final Office Action," for U.S. Appl. No. 16/450,366, filed Sep. 23, 2021 (16 pages).

"Response to Non-Final Office Action," for U.S. Appl. No. 16/450,366, filed Apr. 9, 2021 (15 pages).

* cited by examiner

FLEXIBLE CIRCUIT BOARD INTERCONNECTION AND METHODS

This application is a continuation application of U.S. application Ser. No. 15/675,938, filed Aug. 14, 2017, which is a continuation application of U.S. application Ser. No. 14/506,251, filed Oct. 3, 2014, now U.S. Pat. No. 9,736,946, which is a continuation application of U.S. application Ser. No. 13/158,149, filed Jun. 10, 2011, now U.S. Pat. No. 8,851,356, which is a continuation-in-part of U.S. application Ser. No. 12/372,499, filed Feb. 17, 2009, now U.S. Pat. No. 7,980,863, which claims the benefit of U.S. Provisional Application No. 61/028,779, filed Feb. 14, 2008, and U.S. Provisional Application No. 61/037,595, filed on Mar. 18, 2008, the contents of all of which are herein incorporated by reference.

U.S. application Ser. No. 13/158,149, filed Jun. 10, 2011 is also a continuation-in-part of U.S. application Ser. No. 12/406,761, filed Mar. 18, 2009, now U.S. Pat. No. 8,007,286, which claims the benefit of U.S. Provisional Application No. 61/037,595, filed on Mar. 18, 2008, and U.S. Provisional Application No. 61/043,006, filed Apr. 7, 2008, the contents of all of which are herein incorporated by reference.

FIELD OF THE INVENTION

The present invention relates to flexible circuit boards. More specifically, the present invention relates to flexible circuit board interconnections, methods regarding the same, and apparatus regarding the same.

BACKGROUND OF THE INVENTION

In some applications using electronic circuit boards, it is useful to join circuit boards together for the purpose of continuing an electrical circuit. By way of example, it can be useful to join circuit boards together in Solid State Lighting (SSL) or LED Lighting applications. SSL circuits are an extremely important application as SSL is more efficient in converting electricity to light than incandescent, fluorescent, and compact fluorescent systems.

Conventional reflow soldering or wave soldering techniques and equipment provide for the batch processing of individual or panelized circuit boards. Conventional processing methods with reflow or wave soldering equipment are based on the soldering of individual or panelized circuit boards. Individual or panelized circuit boards are prepared with solder paste, populated with various electronic components and then processed through a reflow or wave solder oven. Soldering is achieved in the conventional way through the control of heating profiles and travel through the oven typically along a conveyor system.

SUMMARY OF THE INVENTION

Embodiments of the invention include flexible circuit board interconnections and methods regarding the same. In an embodiment, the invention includes a method of connecting a plurality of flexible circuit boards together comprising the steps applying a solder composition between an upper surface of a first flexible circuit board and a lower surface of a second flexible circuit board; holding the upper surface of the first flexible circuit board and the lower surface of the second flexible circuit board together; and reflowing the solder composition with a heat source to bond the first flexible circuit board and the second flexible circuit board together to form a flexible circuit board strip having a length longer than either of the first flexible circuit board or second flexible circuit board separately.

In an embodiment the invention includes a circuit board clamp for holding flexible circuit boards together, the clamp including a u-shaped fastener; a spring tension arm connected to the u-shaped fastener; and an attachment mechanism connected to the spring tension arm.

This summary is an overview of some of the teachings of the present application and is not intended to be an exclusive or exhaustive treatment of the present subject matter. Further details are found in the detailed description and appended claims. Other aspects will be apparent to persons skilled in the art upon reading and understanding the following detailed description and viewing the drawings that form a part thereof, each of which is not to be taken in a limiting sense. The scope of the present invention is defined by the appended claims and their legal equivalents.

BRIEF DESCRIPTION OF THE FIGURES

The invention may be more completely understood in connection with the following drawings, in which.

Figure 1:
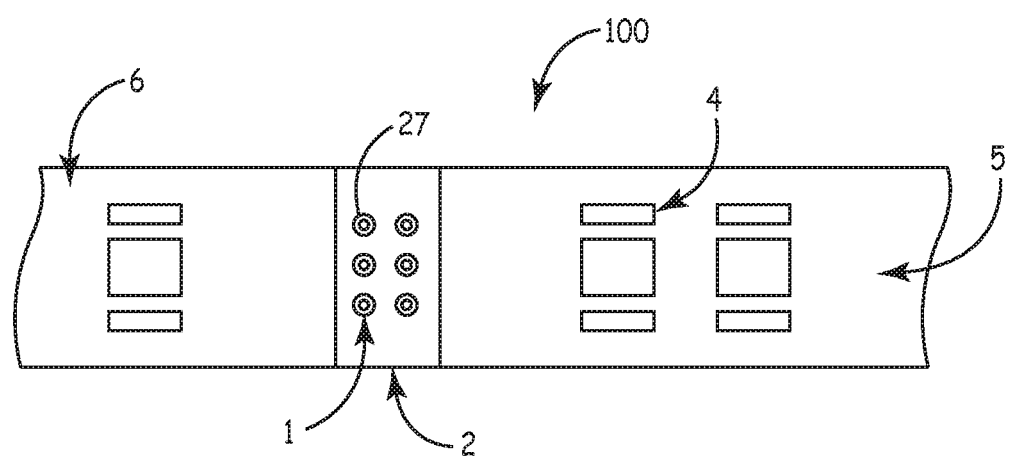
FIG. 1 is a schematic top view of two circuit boards connected with connector in accordance with various embodiments herein.

While the invention is susceptible to various modifications and alternative forms, specifics thereof have been shown by way of example and drawings, and will be described in detail. It should be understood, however, that the invention is not limited to the particular embodiments described. On the contrary, the intention is to cover modifications, equivalents, and alternatives falling within the spirit and scope of the invention.

DETAILED DESCRIPTION OF THE INVENTION

The embodiments of the present invention described herein are not intended to be exhaustive or to limit the invention to the precise forms disclosed in the following detailed description. Rather, the embodiments are chosen and described so that others skilled in the art can appreciate and understand the principles and practices of the present invention.

All publications and patents mentioned herein are hereby incorporated by reference. The publications and patents disclosed herein are provided solely for their disclosure. Nothing herein is to be construed as an admission that the inventors are not entitled to antedate any publication and/or patent, including any publication and/or patent cited herein.

It can be advantageous to construct long continuous circuits for use in linear lighting systems or other configurations constructed from linear strip systems. While certain methods can provide for the creation of long linear SSL circuits through manual soldering, these methods do not address how to build long continuous strips utilizing conventional techniques and equipment such as reflow soldering or wave soldering equipment.

While the soldering of individual electronic components onto circuit boards is readily accomplished with reflow or wave soldering equipment, the soldering together of individual or panelized circuit boards to each other using this same equipment and standard techniques is not easily accomplished for a number of reasons.

First, the solder connection of individual or panelized circuit boards to each other using conventional reflow or wave soldering equipment and techniques requires that the boards be held in some fashion throughout the entire soldering processes. The method and apparatus for holding needs to provide for adequate contact between the boards to allow the heated solder to flow and wet between the boards and intended solder pad areas.

The holding method and apparatus must also not interfere with the heating of the boards and solder paste material. Methods or apparatus laid directly on top of board solder joints would tend to interfere with heat flow to the solder joints resulting in incomplete to weak solder joints. Apparatus constructed from materials affected by the liquid solder would tend to interfere with the solder joint or become trapped as part of the joint interfering with the quality of the joint.

The holding method and apparatus also needs to provide adequate alignment of the circuit boards in order to maintain the relative position of solder pads through the entire process. Wave soldering approaches where waves of molten solder are passed over the boards is also particularly challenging for maintaining alignment. Reflow soldering techniques present challenges in alignment as the solder pasted circuit boards moving down a conveyor can be easily knocked out of position if simply laid onto of one another. Apparatus placed directly on top of boards would tend to interfere with heat flow and limit visual inspection of solder joint quality. Heating profiles along the conveyor along with the flow of solder present further challenges as parts move and change shape due to thermal expansion and contraction during heating and cooling through the reflow heating cycle along the conveyor. Parts would also need to be held from movement due to changes in surface tension as solder flux is heated and the liquid solder flows out over the board and throughout the intended solder joint. Solder cooling from liquid to solid in the later stages of the reflow heating cycle would further add force and movement to boards.

It would be further advantageous if the holding method and apparatus did not interfere with visual inspection of solder joints whether manual or automated. Large or opaque clamping apparatus would tend to prevent any visual inspection of the solder joint complicating inspection and quality control. Additionally, it would be advantageous that the holding method be removable so as to not interfere with the end use of the resulting electronic circuit.

Embodiments herein include a method for creating long and long continuous circuit strips utilizing reflow or wave solder processing equipment and techniques. Further included are methods for holding a plurality of circuit boards and an apparatus for holding a plurality of circuit boards together during reflow or wave solder processing for the purpose of constructing reliable and repeatable solder joints between the circuit boards.

In some embodiments a method for creating long and long continuous circuit strips by which a plurality of bottom circuit boards and a plurality of top circuit boards are prepared with solder paste, aligned for connection and held in place with a holding apparatus and processed through reflow or wave soldering process. The method disclosed addresses the connection of populated circuit boards with solder paste and electronic components for soldering, the connection of unpopulated plurality of circuit boards for later population with electronic components through a secondary soldering process and the connection of pre-populated and pre-soldered plurality of circuit boards for soldering of the board-to-board connection only.

In some embodiments a method is included for holding a plurality of circuit boards together that provides for alignment of mating solder locations held in position throughout a reflow or wave soldering process. The embodiment includes a plurality of top circuit boards (a) and plurality of bottom circuit boards (b). Top circuit boards (a) including solder pad features with plated holes through the top board at pad locations allow solder and heat to flow down into the connection both to facilitate solder connection and to enable rapid connection.

The method of holding applies a downward force on top of a prepared joint near the intended solder location point and an opposing downward force on the bottom of a prepared joint directly below the intended solder location. The forces are separated by a short distance and result in a moment force at the prepared solder joint connection. The applied forces and resulting moment force create sufficient friction force between the top and bottom circuit boards to resist movement due to lateral or longitudinal forces typical in reflow or wave soldering and are therefore sufficient to maintain alignment of the top board and bottom board pad locations throughout the process.

Some embodiments herein are directed to an apparatus for holding a plurality of circuit boards together to provide for alignment of mating solder locations held in position throughout a reflow or wave soldering process. The apparatus in some embodiments is in the form of a circuit board clamp. The circuit board clamp can include a fastener, such as a u-shaped fastener, to apply pressure to a plurality of top circuit boards and bottom circuit boards. The circuit board clamp can also include a spring tension arm connected to the u-shaped fastener. In addition, an attachment mechanism can be connected to the spring tension arm on the opposite end from the fastener. The attachment mechanism can serve to provide attachment to the lower circuit boards. In some embodiments, the attachment mechanism is a hook. The spring tension arm can provide spring force between the fastener end and the attachment mechanism.

In some embodiments, a method for creating long and long continuous circuit strips utilizing reflow or wave solder processing equipment and techniques is included. Further included are methods for holding a plurality of circuit boards and an apparatus for holding a plurality of circuit boards together during reflow or wave solder processing for the purpose of constructing reliable and repeatable solder joints between the circuit boards.

With reference to FIG. 1, a schematic top view of two circuit boards connected with a connector in an embodiment is shown. Circuit boards 5 and 6 are shown joined with connector board 2 to create LED circuit 100. While the embodiment shown in FIG. 1 is directed towards flexible lighting circuit boards and more directly towards flexible LED circuit boards, it will be appreciated that the scope of embodiments herein are not limited to flexible lighting circuit boards and can include many different types of circuit boards.

While connector board 2 is shown coupling the top surfaces of circuit boards 5 and 6 it is fully contemplated connector board 2 could be coupled between circuit boards 5 and 6 in most any fashion including on the bottom surface of circuit boards 5 and 6 and overlapping between a top surface and a bottom surface. Circuit boards 5 and 6 are shown with component pads 4 for receiving LEDs or other components. Connector board 2 has plated through holes 1 disposed in conductive metal pads 27. Plated through holes 1 allow solder to flow through to connect circuit boards 5 and 6 as will be discussed in more detail below.

Figure 2:
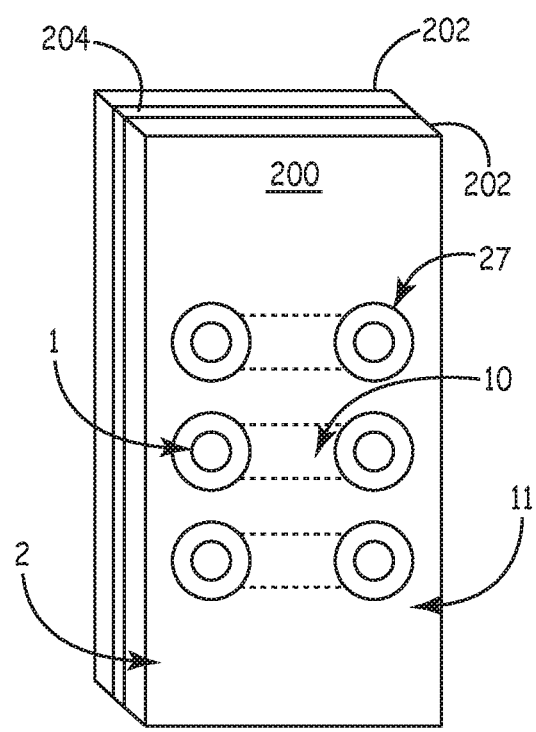
FIG. 2 is a schematic top view of a top profile view of a connector board in accordance with various embodiments herein.

With reference to FIG. 2, a top profile view of a connector board in an embodiment is shown. Connector board 2 consists of a thin circuit board 200 comprised of two electrically conductive layers 202 with a thin electrical isolating material 204 sandwiched in between. In some embodiments, the conductive layers can be made of a conductive metal in various thicknesses. By way of example, in some embodiments, the conductive layers can be made of copper. In a particular embodiment, the electrically conductive layers are 2 oz. copper. It will be appreciated that many different materials can be used for the electrical isolating material. Such materials can have various thicknesses. In some embodiments, the electrical isolating material can be fiberglass. In a particular embodiment the electrical isolating material is 0.012 inch thick fiberglass composite material.

Circuit paths 10 of various designs can be etched into the top and/or bottom conductive layers to produce the circuit conductive paths. Plated through holes 1 can be added at metal pads 27 and plated through with conductive metal to form a connection between top and bottom. Thin layers of non-conductive solder repelling material 11 (solder masks) can be added to the top and bottom of the board to restrict the movement of solder and protect the circuit paths from the pads.

Figure 3:
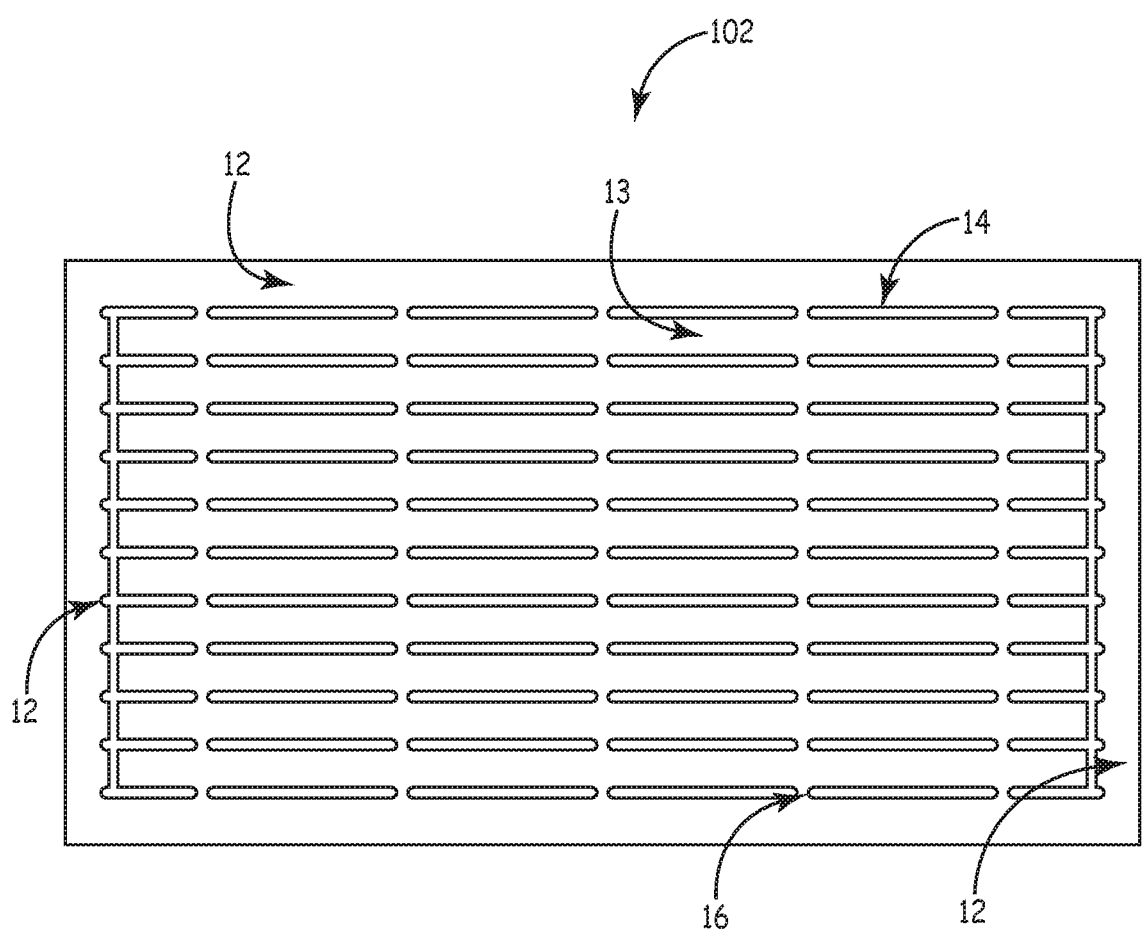
FIG. 3 is a schematic top profile view of an outline of routed panel ready for component assembly and cutting in accordance with various embodiments herein.

With reference to FIG. 3, a top profile view of an outline of a routed panel ready for component assembly and cutting in an embodiment is shown. Panels 102 of thin, flexible printed circuit boards can be fabricated and routed so there is some amount of material 12 remaining to keep multiple parallel boards 13 in a parallel array. The material 12 outside of the circuit board array further stiffens panel 102 and may contain alignment marks or tooling holes for mechanical handling and alignment. Tabs 16 in a repeating pattern can be used to hold circuit boards 13 together. Routed slits 14 between tabs 16 can be used to maintain mechanical alignment during assembly.

Panels 102 can be configured to allow them to be cut with a conventional shear, scissors, or other cutting device at any of several locations enabling later trimming to length or separation. It is fully contemplated panels 102 could be laser cut as well to obtain circuit boards 5 and 6. Circuit boards 5 and 6 can be part of panels 102 as indicated by circuit board location 13. Electrical components, including LED emitters and optionally thin board connectors can be assembled onto panels 102 by conventional methods of electronic solder assembly. In some embodiments, the connector pad geometry can be incorporated into the board design so an additional connector board is not required, rather circuit boards 5 and 6 can be directly fastened together.

Figure 4:
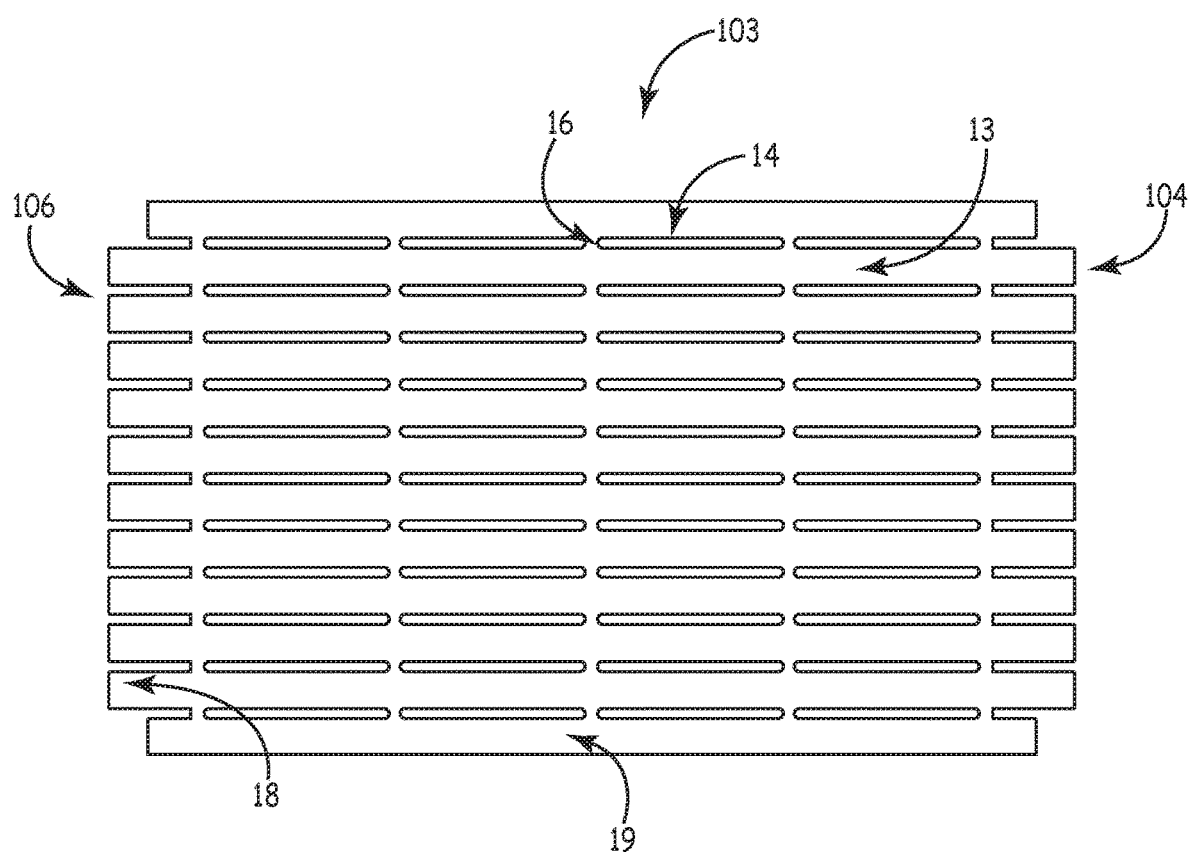
FIG. 4 is a schematic top profile view of a panel outline with ends sheared off to expose boards in accordance with various embodiments herein.

With reference to FIG. 4, a top profile view of a panel outline with ends sheared off to expose boards is shown in accordance with an embodiment. As shown, sheared panel 103 frees up one or both ends 106 and 104 of each printed circuit board 13. In some embodiments, this can be done during the original panel fabrication. In some embodiments, a portion of the frame 19 may be retained to add stiffness to the assembly and may contain alignment marks and tooling holes used to maintain mechanical alignment during assembly.

Figure 5:
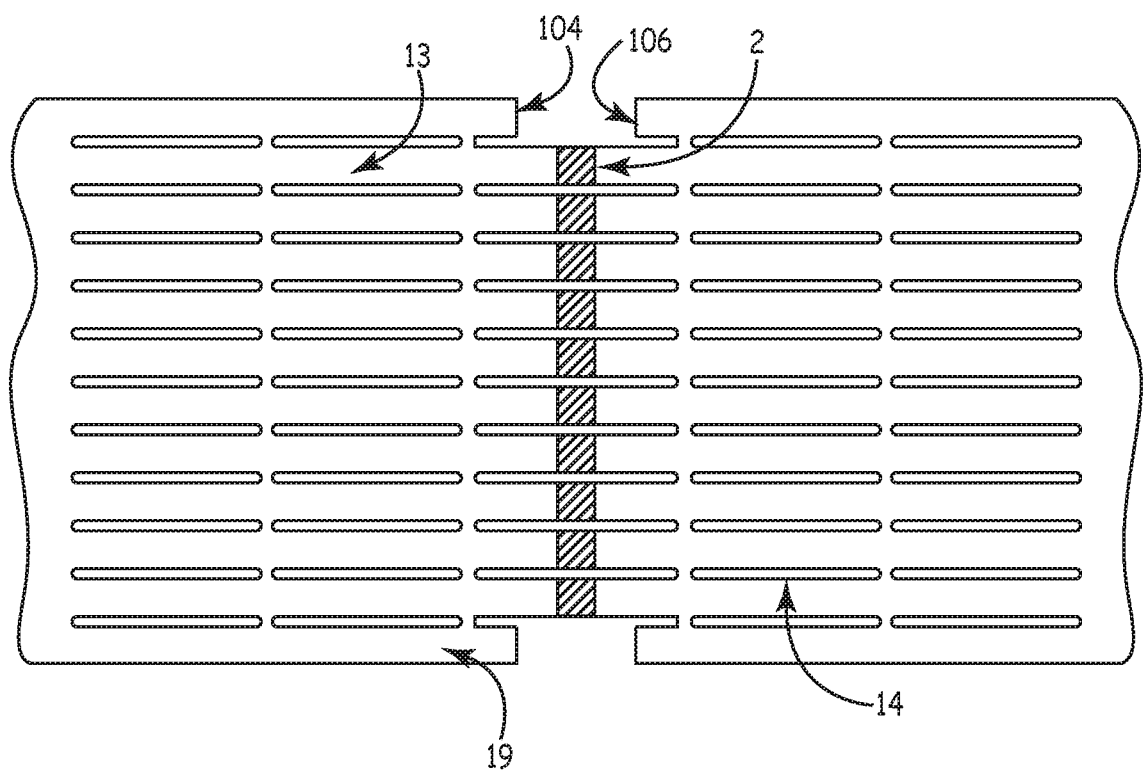
FIG. 5 is a schematic top profile view of panels joined by connectors in accordance with various embodiments herein.

With reference to FIG. 5, a top profile view of panels joined by connectors in an embodiment is shown. A free end 104 of one panel can be butted against a free end 106 of the other so several circuit boards can be joined by soldering or welding, thus forming a longer assembly with the same characteristic of parallel strips. Depending on desired length, the process can be repeated by adding additional panels 103 to an elongated panel made up of multiple panels 103. After the desired length is attained, the strips can be separated by shearing any remaining connecting material. As the long strips are joined, lined thermal adhesive tape 28 (FIG. 8) can be affixed to the bottom of the strips in a continuous action. The exposed liner (not shown) can be later removed during application of the joined strips to a fixture or permanent mount. The addition of thermal adhesive tape 28 can occur just before or after panels 103 are joined together. The resulting elongated strips can then be wound onto large diameter reels so they can be easily protected, transported, and stored; ready for final assembly onto heat sinks or light fixtures. As an alternative, the strips can be short enough to be packaged and shipped in flat form.

Figure 6:
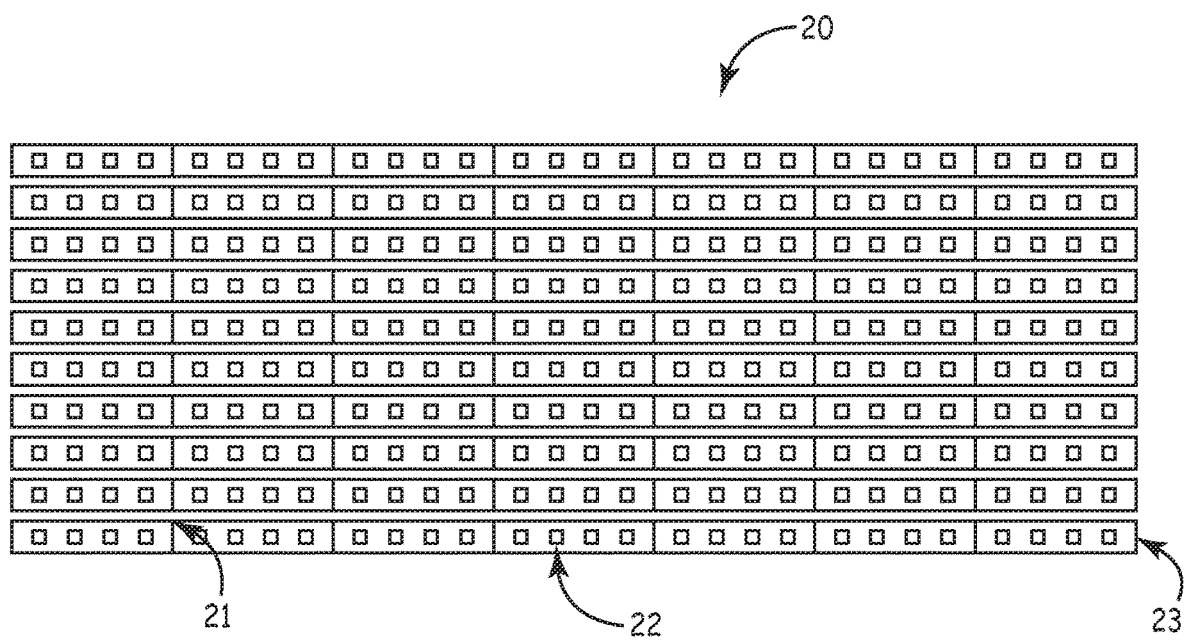
FIG. 6 is a schematic top profile view of circuit strips after separation in accordance with various embodiments herein.

With reference to FIG. 6, a top profile view of circuit strips after separation in an embodiment is shown. As shown, circuit strips 20 can be separated from panels 103. Connection point 21 connecting two or more circuit strips can be a connector 2 as discussed above or an overlap joint discussed in more detail below. LEDs 22 or other components can be adhered or placed on circuit strips 20 and circuit strips 20 can terminate at ends 23.

Figure 7:
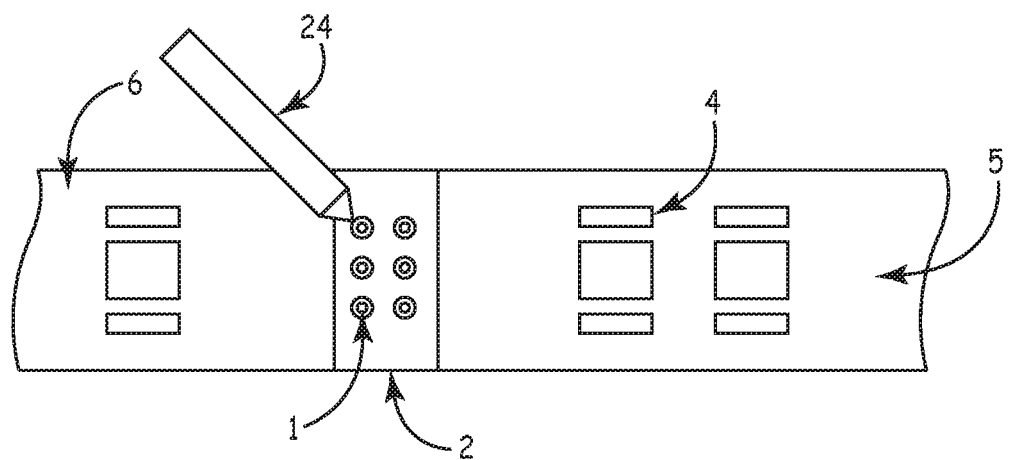
FIG. 7 is a schematic top profile view of soldering of connector joint in accordance with various embodiments herein.

With reference to FIG. 7, a top profile view of soldering of a connector joint in an embodiment is shown. Connector board 2 can be flexible enough to conform to normal variations of board thickness, solder height and mechanical mounting height differences. In an embodiment, connector board 2 is shown to bend with a radius 42 of down to 1 inch (see FIG. 14). The connector board 2 can allow heat and solder to easily flow through connector board 2 from top to bottom as heat is applied. Solder may be introduced into through hole 1 at the top of connector board 2. Alternatively solder may be in paste or hard form deposited on receiving printed circuit board 5 or 6, in which case solder will flow from bottom to top.

Electrically insulating layer 204 within the thin board is thin enough to both enable a high degree of thermal conductivity and is able to maintain high levels of electrical breakdown isolation. Electrical isolation between circuits is helpful to the general function of the connector; however, the amount of isolation may be changed to conform to the application requirements.

The material chosen for the electrical insulating layer can enhance thermal conductivity. In one embodiment the electrically insulating layer was chosen as a high temperature variant of FR4 fiberglass with a glass transition temperature of 170° C., although this is just one example and many other materials can be used. A higher than normal temperature rating of the material can be used to gain more thermal margin allowing for the very rapid heating (and probable overheating during manual assembly) of the thin boards due to their low thermal mass. Even higher temperature materials can be used in the case higher melting temperature solders are to be used. In some embodiments, the insulating layer is both durable at high temperatures and as highly thermally conductive as possible for this construction. Thermal conductivity can be helpful for the cases of solder iron or point heat source assembly because it aides in rapid transfer of heat from the top side of the connector to the joints below.

Thin connector 2 board can add flexibility to connection 21, reducing stress at the solder joint associated with the use of rigid pins and other types of connectors. This is helpful to prevent tearing of the printed circuit board pads on the board when bending stresses are introduced. In one implementation, connector boards 2 can be used to form a continuous strip of boards which is then rolled into reel form. The bend radius 42 of this implementation can be 6 inches or greater.

Thin board substrate materials and thicknesses can be selected to handle solder melt temperatures without delamination or damage. Alternate choices for board insulating material can include materials such as THERMAGON™ thermally conductive materials in cases where higher temperature resilience and higher thermal conductivity are needed. An embodiment was developed for use with lower temperature solders (leaded). Copper pads can be on the bottom side of the connector or upper board 31 and can be designed to match the pads of the receiving board 33—in spacing, in area, in thermal characteristics.

Figure 8:
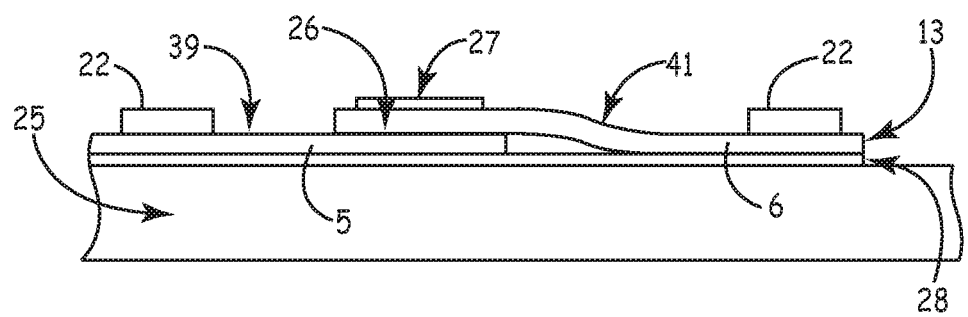
FIG. 8 is a schematic side profile view of an overlapping joint between boards in accordance with an alternate embodiment herein.
Figure 11A:
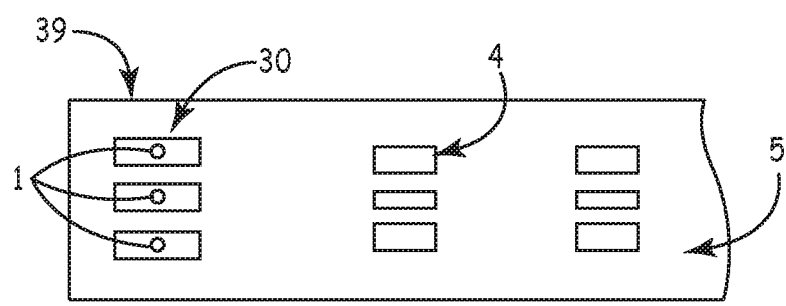
FIG. 11A is a schematic top view of top board pads and holes in accordance with various embodiments herein.
Figure 11B:
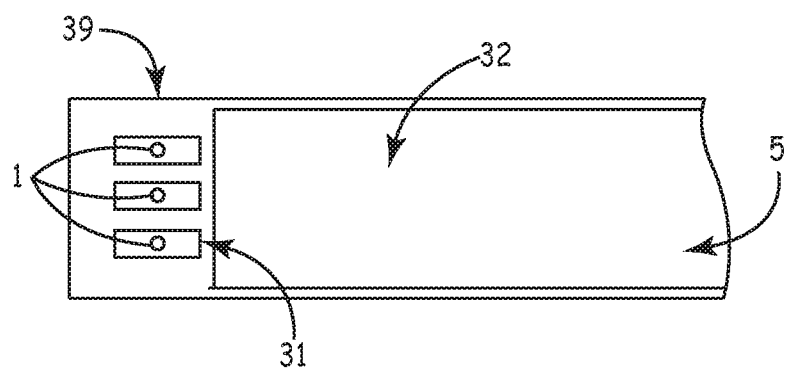
FIG. 11B is a schematic bottom view of top board pads and holes in accordance with various embodiments herein.
Figure 12:
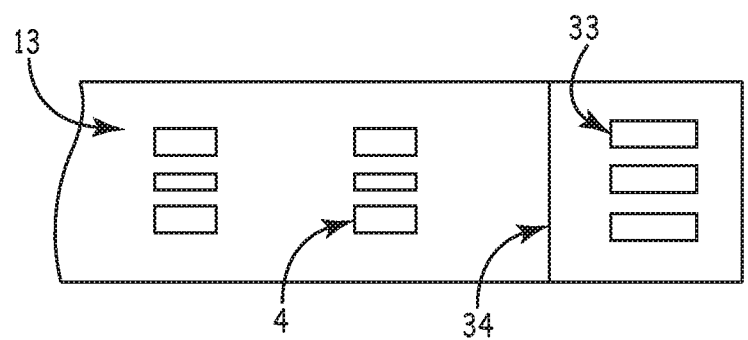
FIG. 12 is a schematic top view of bottom board receiving pad geometry in accordance with various embodiments herein.
Figure 13A:
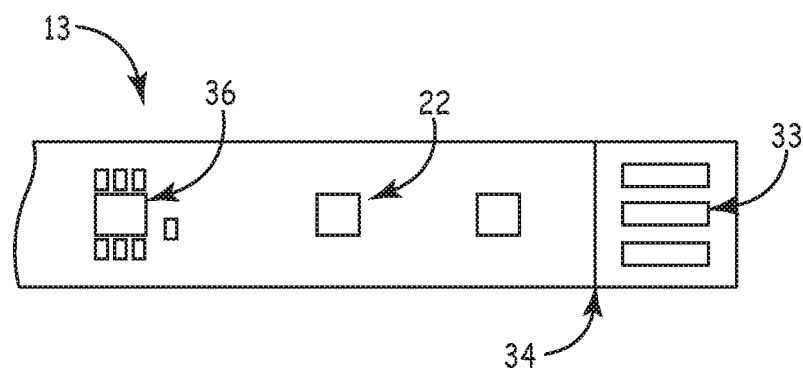
FIG. 13A is a schematic top view of an assembled board prior to joining in accordance with various embodiments herein.
Figure 13B:
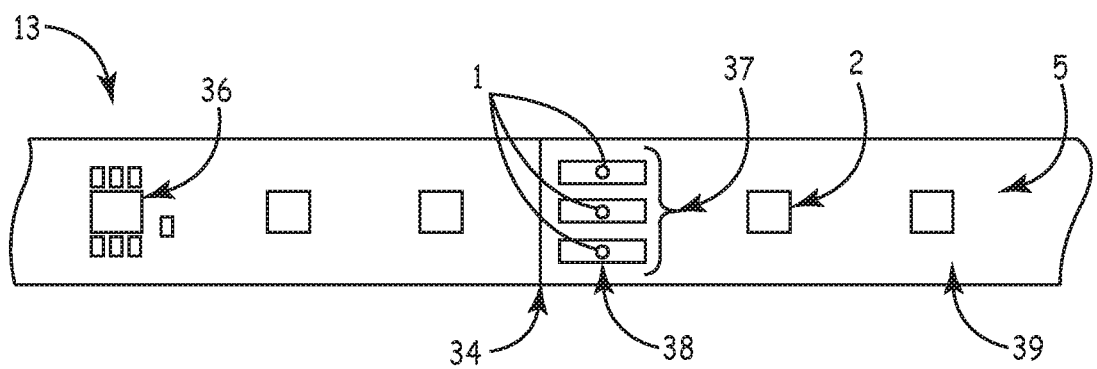
FIG. 13B is a schematic top view of joined boards in accordance with various embodiments herein.

With reference to FIG. 8, a side profile view of an overlapping joint between boards in an alternate embodiment is shown. In the embodiment of FIG. 8 no connector board 2 is used to connect circuit boards 5 and 6. The bottom side of an end of circuit board 6 is directly connected to the top side of an end of circuit board 5. Conductive metal pads 27 can be on the top side to receive heat (such as from a soldering iron 24, shown in FIG. 7) and provide a path for conduction through the electrically insulating substrate and/or a plated through hole 1 to conductive metal pads 33 (shown for example in FIG. 12) on the bottom. The size of pads 30, 31 and 33 (FIGS. 11A, 11B and 12) factor into both the quality of the connection and the mechanical stress the connection can sustain. In some embodiments, by embedding or closely connecting through holes 1 to pads 31, 38, the mechanical performance can be improved. The metal plating and solder fill through hole 1 links top side pads 27 to bottom side pads 33 making the bottom side very difficult to pull off (delaminate) from the insulating layer. Through holes can be of various sizes. In some embodiments, the through holes can be about 0.036 inches in diameter to promote heat transfer, conduct solder and add enough structure to strengthen the joint. Lapped joints add strength by adding additional contact area, by reducing leverage, and by changing certain forces from shearing and tensile to compressive.

The interconnect aspect of FIG. 8 allows for the coupling of circuit boards without a connector board or any other device between them. Thus circuit boards 5 and 6 can be created with ends 104 and 106 which have pads 30, 31 and 33 with though holes 1 to allow coupling of the circuit boards.

Copper conductors can be used for connecting pads 27 to be mated to circuit path 10. Circuit path 10 can be printed in almost any pattern, such as those commonly used in circuit boards and can be patterned to receive electronic components 4 such as LEDs 22, integrated circuits 36, or other electronic components. In some embodiments, the copper conductors can be very thick and wide to accommodate high currents. In a particular embodiment 2 oz. copper was used with a conductor width of 0.040 inch to enable a low voltage drop across the connector when carrying up to 5 amps of current.

Copper foils are designed to maintain gap distances between connections for electrical isolation. In an embodiment, voltage isolations of up to 500 V were maintained by maintaining a distance of 0.025 inches between copper foils. By increasing the spacing, substantially higher isolations can be achieved. Copper conductors can be run on top of or under the connector insulating substrate, depending on requirements for isolation, current carrying capacity and protection. Connections and conductors are protected from damage or shorting by being covered by the connector body or overlapping joint 26.

Connections and conductors can be further protected from moisture by the simple addition of an under fill layer of potting material or an encapsulant or an overcoat of potting material 29 or encapsulant. Potting compounds or conformal coatings are commonly used in the industry to provide this type of protection. This type of connector is particularly suitable for these coatings because it is essentially flat with no recesses or areas which must be protected from contact with the coatings.

Plated through holes 1 located at pad positions 27, 30 and 31 through connector board 2 allow solder and heat to flow down into the connection both to facilitate solder connection and to enable rapid connection. The rate of heat transfer being increased by this structure has the additional benefit of speeding up solder melting and cooling both during manual soldering and reflow processing. This can save time and result in better, more repeatable and stronger joints.

A number of experiments were conducted to determine solder wetting and flow paths for various pad geometries using the thin connectors in surface mount applications. After it is melted, solder tends to wet to the metal pads 30 and exposed conductors of printed circuit boards 5 and 6. It moves by capillary action to actively fill small gaps and spaces between pads 31 and 33, particularly pads in flat surface-to-surface contact. The high degree of adhesion and capillary action exhibited by solder, combined with the mechanical weight of the thin board connector caused pads of connector board 2 and circuit boards 5 and 6 to pull together pushing remaining solder outward between pads 31 and 33. If solder was applied in exactly the correct amount, the solder would simply fill the joints. But even in small excess, the solder would press outside of the pad areas promoting shorts and lower electrical isolation. Holes, recesses or pockets between the pads were tried and did take up the excess solder. However, the approach was to design in plated holes 1 within the area of the pads taking up the solder through capillary action, effectively pulling excesses into rather than out of the joint. In a particular embodiment, the holes were approximately 50% of the diameter of the pad, giving ample room for significant variances in solder application. Though it will be appreciated that other hole size to pad diameter ratios can be used.

In some embodiments, plated holes 1 can be used as receptacles for solder paste so connectors 2 could be ready for joining by heat alone. Once aligned to printed circuit boards 5 and 6, connector 2 (or selectively its pads) can be heated to cause the solder to begin melting for example using a soldering iron 24. By capillary action and wetting, the solder quickly flows down into the space between connector 2 and board pads completing the joint. Flux and activating resins, which are commonly incorporated into solder paste, are needed for high quality solder joints. In one embodiment, the same plated through holes 1 used to store solder prior to thermal joining absorb excess solder. Further, the holes can be filled with either solder paste or separated layers of hard solder and flux resin. In one embodiment, solder wire with a core of flux resin can be press fit in holes 1 and sheared to match the connector bottom surface 26. It was experimentally determined that this was another effective way of putting solder and flux into plated holes 1. Sealing of solder paste in holes 1 at pad positions 27 and 26 can be helpful so paste remains fresh for later use. Sealing can include a thin solder layer, a thin flux layer or a thin plastic or metallic peel off material.

As part of the printed circuit board fabrication process, mask coatings can be placed over top 11 and the bottom of the connector board (open at the pads), reducing the opportunity for solder shorts and improving the appearance of the connector or overlapping joint. In some embodiments, the mask coating can be chosen to match the color and characteristics of the boards being jointed so to minimize the visibility of connector board 2. Connector board 2 can be implemented without mask coatings on the top surface as this is less critical to the solder flow protection function.

Connector boards 2 can be easily mechanically formed for vertical step offsets 41. In experiments run on these connectors 2, bends up to a right angle could be performed with the conductors (or any foils crossing the bend) on the inside radius of the bend.

Connector boards 2 can incorporate other circuits, including pads and geometries for wire or other conventional types of connectors, as well as being able to incorporate terminations and active circuitry. Connector board 2 is particularly well suited because of its highly thermally conductive structure for power and heat creating circuits. In one implementation, the circuitry included a high current driver (One Semiconductor #NUD4001 operating at 24 VDC) along with an LED string added to the top side of the board. Both the top (FIG. 11*a*) and bottom side (FIG. 11*b*) of the board were designed with large metal (such as copper) pads 30 and 31 that could translate heat through the thin insulating material by effectively creating a large area for heat transfer from the top copper layer through the less thermally conductive insulating layer and to the bottom copper layer. Further, a thermally conductive adhesive tape 28 (e.g., 3M product #8810) can be applied to the back side. The assembly can then be adhered to a heat sink 25. The resulting structure was found to maintain excellent heat transfer to the heat sink, which is particularly important in high brightness LED applications.

Because this connector can be easily fabricated in many shapes, it can be used for connection between boards directly abutted (FIG. 5) or some distance apart. Also, since the conductors can be on either top or bottom, or embedded in a center layer, electrical isolation from neighboring structures can be high and possible shorting points can be readily avoided. Connector boards 2 are stackable and can be soldered one to another.

In cases where additional mechanical support is needed, the connector can extend well beyond the pad providing maximum overlap. It may be necessary to shape the connector or have it fabricated with clearance holes if components on the underlying board may interfere. Connector board 2 can be fabricated with additional pads and holes (not connected to the circuits) to give additional strain relief. Pad geometries may match existing pinned connectors to allow the option to alternate use of a pinned connector or thin board connector. Thin connector boards may be used to join circuit boards into strips 20 or matrixes with multiple connectors or connections 21 in each assembled length (See FIG. 6).

Figure 9:
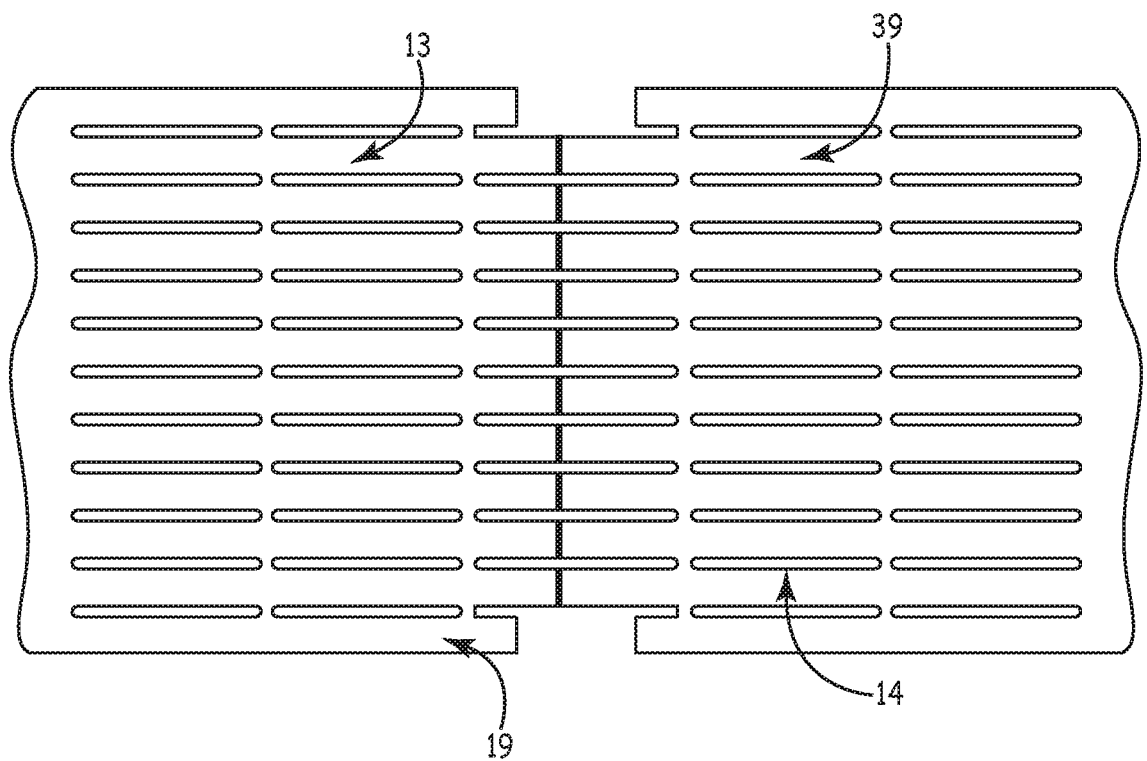
FIG. 9 is a schematic top profile view of panels joined by overlapping joints in accordance with various embodiments herein.

Thin connector boards can be overlapped for interconnection (See FIG. 8). This is very useful if the connector board contains active circuitry and it is beneficial to connect multiple boards, such as in the fabrication of a continuous strip of boards (See, e.g., FIG. 6). The thin connector boards can be highly advantageous to the assembly of strips consisting of multiple circuit boards (See FIG. 9). In a practical application, they can be used to make long circuit board strips of solid state lighting circuits (e.g., high power LED emitters used as the individual light sources), amongst other applications.

Thin circuit board 13 can include a thin, low thermal mass substrate base material comprised of two electrically conductive layers with a thin, electrically isolating material sandwiched in between. In some embodiments, the conductive layers can be made of a conductive metal in various thicknesses. By way of example, in some embodiments, the conductive layers can be made of copper. In a particular embodiment, the electrically conductive layers are 2 oz. copper. It will be appreciated that many different materials can be used for the electrical isolating material. Such materials can have various thicknesses. In some embodiments, the electrical isolating material can be fiberglass. In a particular embodiment the electrical isolating material is 0.012 inch thick fiberglass composite material. Circuit patterns of various designs can be etched into the top and bottom conductive layers to produce the circuit conductive paths. Holes can be added at the pad locations and plated through with conductive metal to form a connection between top and bottom. Additional thin layers of non-conductive, solder repelling material (solder masks) can be added to the top and bottom of the board to restrict the movement of solder and protect the circuit paths away from the pads.

Angled or other geometric patterns in the pad and copper conductors can be included and can support connections for offset or angled printed circuit boards. Multiple pad sets and associated conductor connections can be included and can allow for splitting of conduction paths.

Figure 14:
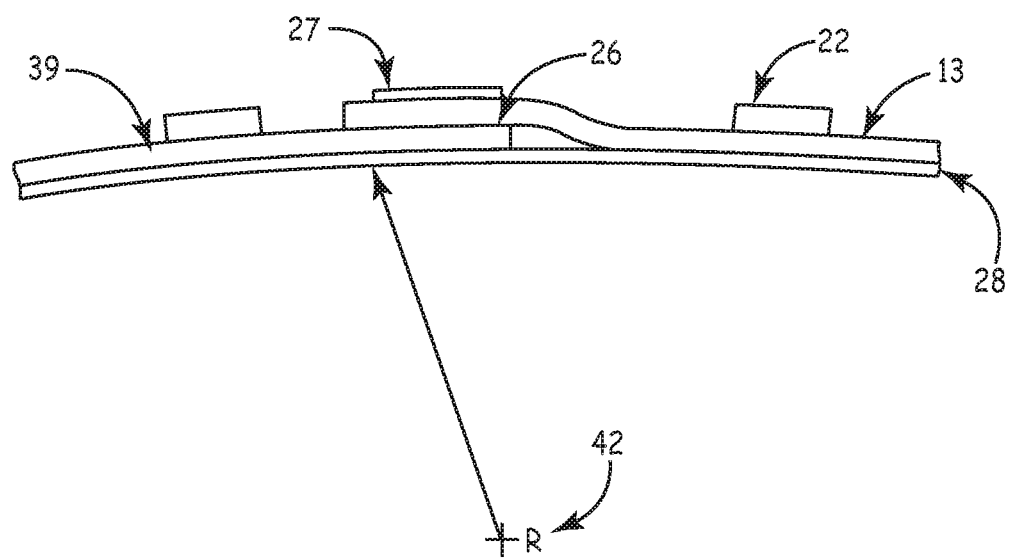
FIG. 14 is a schematic side view of a joint assembly of a flexible strip with curvature in accordance with various embodiments herein.

The thin circuit board as described can be flexible enough to conform to normal variations of board thickness, solder height, and mechanical mounting height differences (See FIG. 14). Goals for high reliability connections include robustness, both in mechanical strength and in integrity of the electrical connection. By increasing the number of pads 30, 31 and 33 used in the connector, mechanical strength was increased. Simple multiplication of the number of contacts added to the strength by spreading stress across the added contacts. Redundant parallel contacts reduce electrical resistance and add to the general integrity of electrical connection.

Intimate contact between metal pads with minimal fill layer of solder increases joint 26 strength. A thick layer of solder decreases strength but adds some flexibility to the joint. Solder generally has a much lower tensile and shear strength than the conductors it joins. Further, it tends to have a course crystalline structure and is susceptible to fracturing. However, a thin layer of solder between copper pads (used the pad material) is much less susceptible to fracturing both because of smaller (or incomplete) crystal formation, and because stresses are transferred locally to the stronger copper, instead of into the solder itself.

Increasing the size of the pads 31 and 33 increases the strength both because of the larger solder contact area, but also because of the larger areas of contact and adhesion between pad and insulating substrate. In multiple trials, larger pads consistently increased the strength as measured in pull tests and in bending tests. Larger areas of conductor surrounding exposed, soldered pad apertures increase the strength both by offering more area for adhesion between the conductor and the insulating substrate, but also because they add to the conductor structure.

Increasing the distance across a set of pads 37 or span increases the joint strength against shear and rotational forces and torques. Shear and rotational forces (torques) are common highest during handling of the joined boards. Of particular use, the assembly of multiple boards into long strips presents the opportunity to put very high torques on the joint connection because of the length and spring tension arm advantage. Preventing damage due to rotational forces is helpful to having reliable joints when the strips are packaged and used in their multiple forms including strips and continuous reeled lengths.

By increasing the distance of the pads from the overlapping edges of the board, the inventors have found a decreased leverage on the individual connections by converting stresses into surface pressures away from the joint. By increasing the number of through holes 1 leading from top surface to the pads below, an increase in the strength is discovered by adding more copper cylindrical connections and rivet like columns of solder fill linking top to bottom. Increased number of holes also increases the probability of having a better percentage of solder fill between the boards. The choice of solder type and composition has a direct impact on joint strength. Lead baring solders have lower tensile strength then their lead free counterparts. Higher tensile strength increases the fracture strength of the connection.

Figure 10:
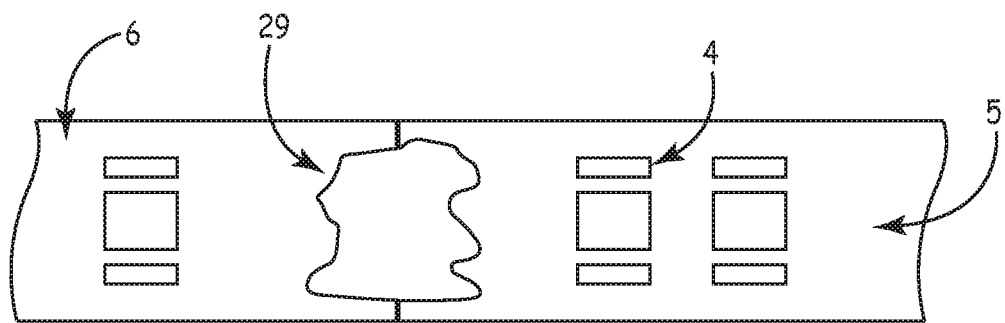
FIG. 10 is a schematic top profile view of potting material used to strengthen and protect connection joints in accordance with various embodiments herein.

The application of tape or adhesive 28, across the bottom side of joint 26, can further increase joint strength for handling. Viscous tapes act as a spring and dampener to certain stresses, moving forces away from the joint. The application of potting material 29 or other adhesives or coatings of structure adds additional strength to joint 26 as well as protection from mechanical damage and/or moisture (See FIG. 10).

In the areas of board overlap, excluding the conductive pad locations, adhesive applied between top and bottom board can be added to increase joint strength. Thin board connectors 2 or thin circuit boards 13 and 39 with overlapping joints 26 can be used to construct elongated strips of multiple circuit boards 20. Mass parallel construction of long circuit board strips carrying high intensity LEDs for SSL applications has been demonstrated using these connection types.

Figure 15:
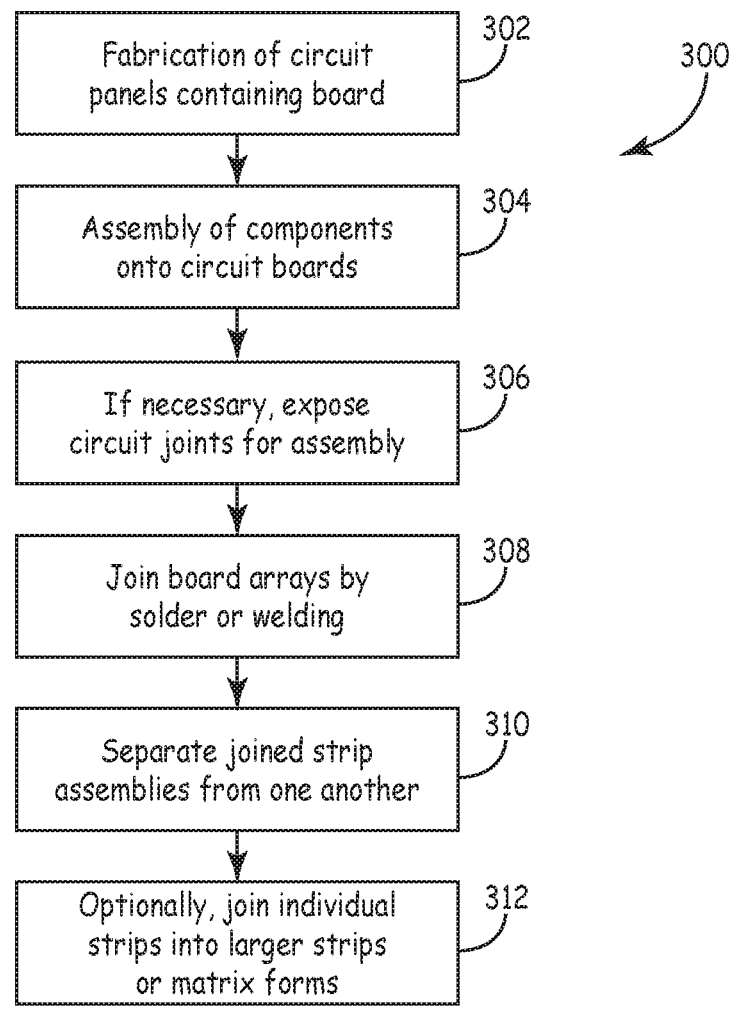
FIG. 15 is a process flow diagram for construction of multi-board assemblies in strip or matrix form in accordance with various embodiments herein.

With reference to FIG. 15, a process flow diagram for construction of multi-board assemblies in strip or matrix form in an embodiment is shown. Process 300 starts at state 302 where circuit panels 102 are fabricated as discussed in detail above. At state 304 components, such as LEDs are coupled to circuit boards 5 and 6, which are developed from panel 102. If necessary, circuit joints 18 are exposed for assembly at state 306. At state 308 board panels or arrays are joined by solder or welding. At state 310 strip assemblies within the board panels or arrays are separated from each other. At state 312 individual strips can be joined into longer strips or matrix (including, for example, some boards arranged perpendicularly to one another) forms.

In some embodiments a method is included for creating long continuous circuit strips in which a plurality of bottom circuit boards and a plurality of top circuit boards are mechanically and electrically connected together by way of a soldered lap joint connection. The soldered lap joint connection results from the processing of the bottom and top plurality of circuit boards through conventional reflow soldering or wave soldering processes.

Figure 16:
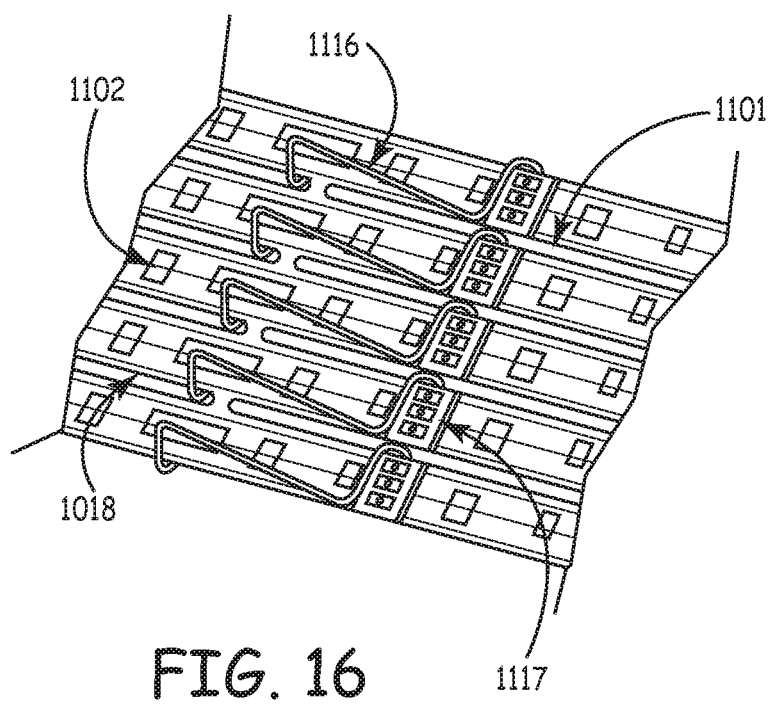
FIG. 16 is a schematic top view of a plurality of circuit boards with holding apparatus in accordance with various embodiments herein.

In reference to FIG. 16, the plurality of bottom circuit boards 1101 and a plurality of top circuit boards 1102 are aligned for connection with a prepared lap joint 1117 and held in place with a circuit board clamp 1116 and processed through either conventional reflow or wave soldering processes. The method disclosed addresses the connection of populated circuit boards with solder paste and electronic components for soldering, the connection of unpopulated plurality of circuit boards for later population with electronic components through a secondary soldering process and the connection of pre-populated and pre-soldered plurality of circuit boards for soldering of the board-to-board connection only.

In some embodiments a method is included for holding a plurality of circuit boards together that provides for alignment of mating solder pads held in position throughout a reflow or wave soldering process. In reference to FIG. 16, a plurality of bottom circuit boards 1101 can be placed onto a conveyor belt or table for advancing the boards into the reflow solder oven. A second plurality of top circuit boards 1102 can is placed on top of the first plurality of circuit boards 1101 with some area of overlap. The placement of the circuit boards is done with care to align the plurality of solder pad features of the top circuit boards 1102 with the bottom circuit boards 1101 to create a prepared joint 1117.

Figure 17:
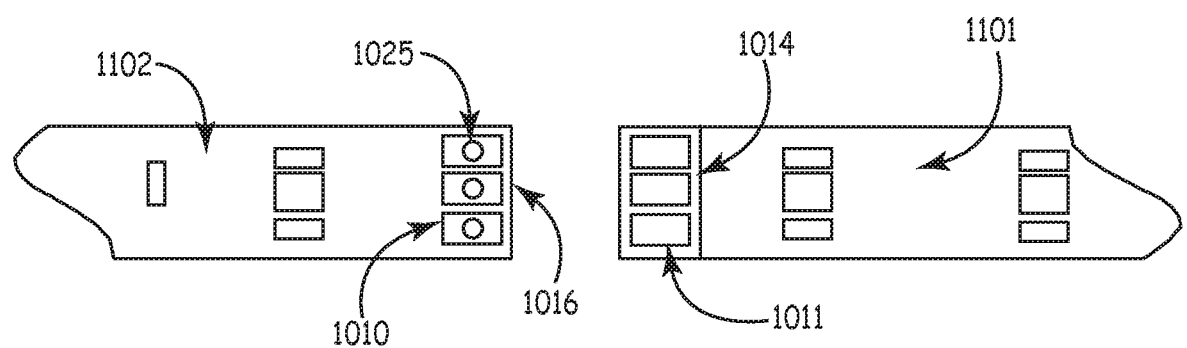
FIG. 17 is a schematic view of two circuit boards with solder pad and plated hole features in the top circuit board and with mating solder pad features on the bottom circuit board in accordance with various embodiments herein.

Referring now to FIG. 17, the alignment of the top and bottom plurality of circuit boards is such that the solder pads 1010 on the top plurality of circuit boards 1102 are aligned with the receiving solder pad 1011 on the bottom plurality of circuit boards 1101. Top circuit boards 1102 including solder pad features previously disclosed with plated holes 1025 through the top board at the pad locations. Plated holes 1025 in the top circuit board 1102 allow solder and heat to flow down into the connection both to facilitate solder connection and to enable rapid connection.

Figure 18:
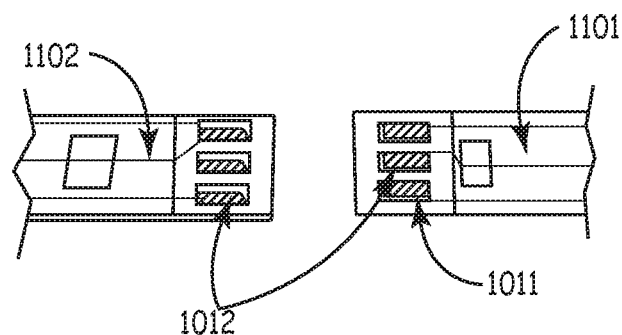
FIG. 18 is a schematic view of two circuit boards with prepared solder pads prior to attachment in accordance with various embodiments herein.

Referring now to FIG. 18, the top and bottom plurality of circuit boards may be prepared in advance with solder paste 1012 onto the solder pads of only the plurality of top circuit boards 1102, or with solder paste 1012 onto the solder pads 1010 of the plurality of top circuit boards 1102 and solder pads 1011 of the plurality of bottom circuit boards 1101, or with solder paste 1012 onto the solder pads 1011 of only the bottom plurality of circuit boards 1101. In some embodiments, the amount of solder paste used is controlled with precision.

Figure 19:
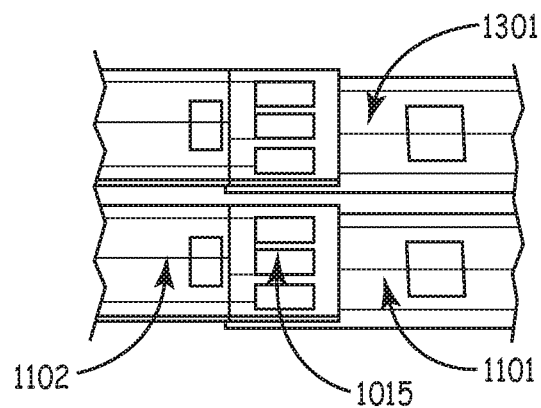
FIG. 19 is a schematic view of a successful solder joint resulting from reflow soldering of a prepared lap joint held by an apparatus and reflow or wave soldered in accordance with various embodiments herein.

Referring now to FIG. 19, the resulting soldered lap joint connection 1124 provides for a reliable mechanical and electrical board-to-board connection for the plurality of top circuit boards 1101 and bottom circuit boards 1102 creating a long circuit board assembly 1301 (or long circuit board strip). The process can be repeated by adding additional top circuit boards 1101 to the newly created long circuit board assembly 1301 to create a long continuous circuit board assembly 1302 (in FIG. 23) (or long continuous circuit board strip).

Figure 20:
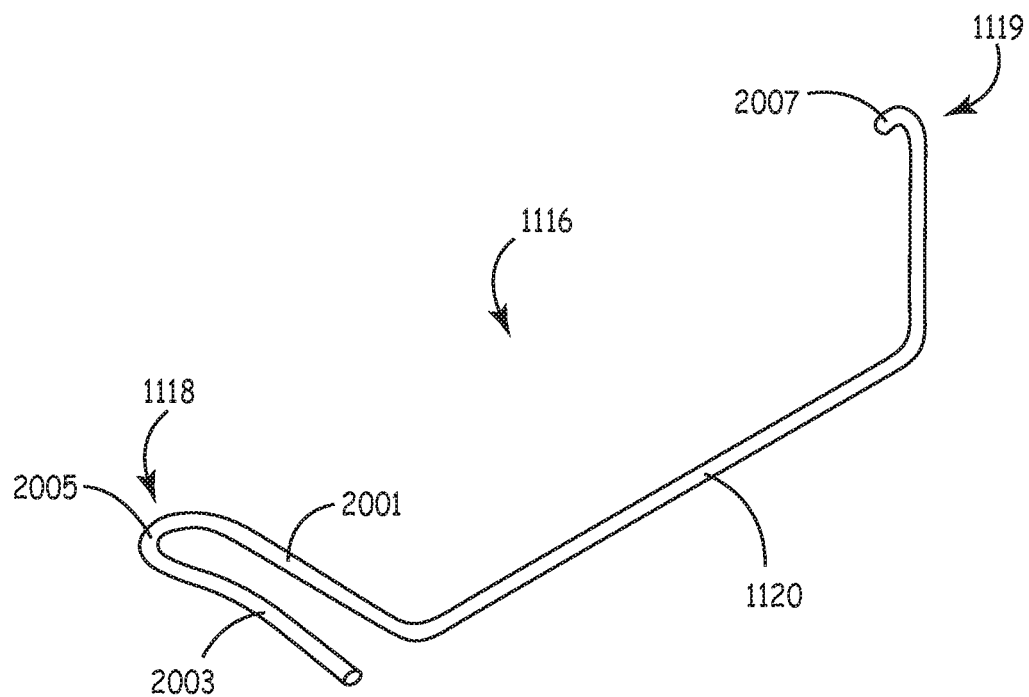
FIG. 20 is a schematic view of a circuit board clamp in accordance with various embodiments herein.

In some embodiments, an apparatus is included for holding a plurality of circuit boards together to provide for alignment of mating solder locations and held in position throughout a reflow or wave soldering process. In some embodiments, this apparatus can be a circuit board clamp. Referring to FIG. 20, the apparatus in some embodiments is in the form of a circuit board clamp 1116 with a fastener 1118, an attachment mechanism 1119 and a spring tension arm 1120. The fastener 1118 applies pressure to a plurality of top circuit boards 1102 and bottom circuit boards 1101. The attachment mechanism 1119 attaches to the bottom of the top circuit boards 1101 and a spring tension arm 1120 provides spring force between the fastener end 1118 and attachment mechanism end 1119. In some embodiments, the fastener 1118 is in the form of a u-shaped fastener. The fastener 1118 can include a top bar portion 2001, a bottom bar portion 2003, and a interconnection member 2005 disposed between the two. In some embodiments, the top bar portion 2001 and the bottom bar portion 2003 are substantially parallel to one another. In some embodiments, the spring tension arm 1120 has a major axis oriented substantially perpendicularly to the top bar portion 2003.

It will be appreciated that the circuit board clamp 1116 may take many shapes in order to accommodate differing boards and connector geometries. The embodiment of FIG. 20 illustrates the form of the circuit board clamp 1116 as constructed from small gauge wire. The selection of a small gauge allows for the fastener end 1118 to easily fit through a narrow routed slot 1121 in the bottom plurality of circuit boards 1102 and be rotated approximately 90 degrees at the intended holding points on the top circuit board at point 1201 and on the bottom circuit board at point 1202 on the overlapping boards (see FIG. 10). The small gauge wire allows for the attachment mechanism end 1119 to pass through the narrow routed slot 1121 in the top plurality of boards 1101. The resulting circuit board clamp 1116 provides the necessary forces as described above to hold the top and bottom plurality of circuit boards in alignment for processing through a reflow or wave soldering operation.

Figure 21:
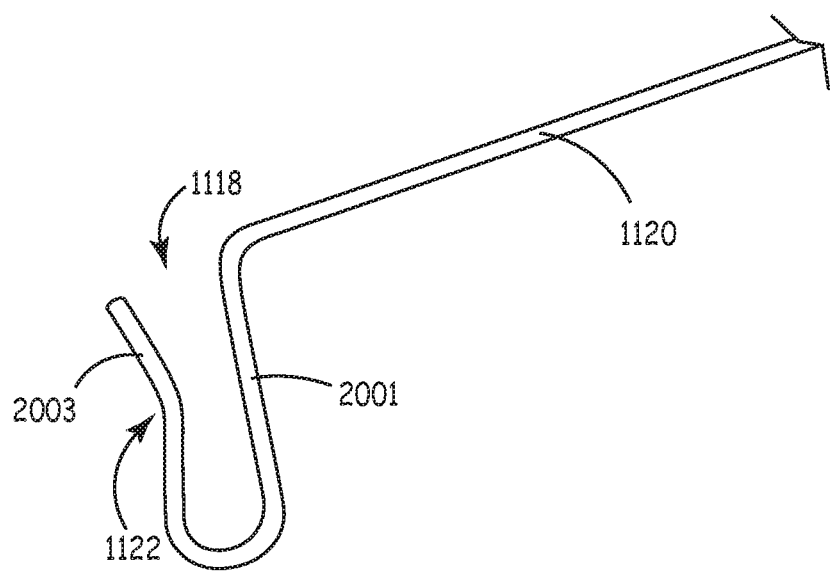
FIG. 21 is a schematic view of a circuit board clamp in accordance with various embodiments herein.

A number of experiments were conducted on the circuit board clamp 1116 embodiment. It was found that a reverse bend 1122 in the bottom bar portion 2003 of the fastener 1118 improved the ability to hold the top circuit board 1101 and bottom circuit board 1102 parallel to each other. The reverse bend 1122 is "reverse" in that it results in the distal end of the bottom bar portion 2003 being pointed away from the top bar portion 2001 as shown in FIG. 21.

Parallel surfaces in the prepared solder joint 1117 were found to improve solder wetting throughout the joint. Further experiments were conducted on the attachment mechanism end 1119 of the circuit board clamp 1116. It was found that a hook attached to the top circuit board 1101 through the narrow routed slot 1121 away from the routed tab between boards 1123 eliminated the need for the circuit board clamp 1116 to be sized specific to each board routing pattern 1121, 1123. In some embodiments, the attachment mechanism 1119 can comprise an attachment hook 2007.

Figure 24:
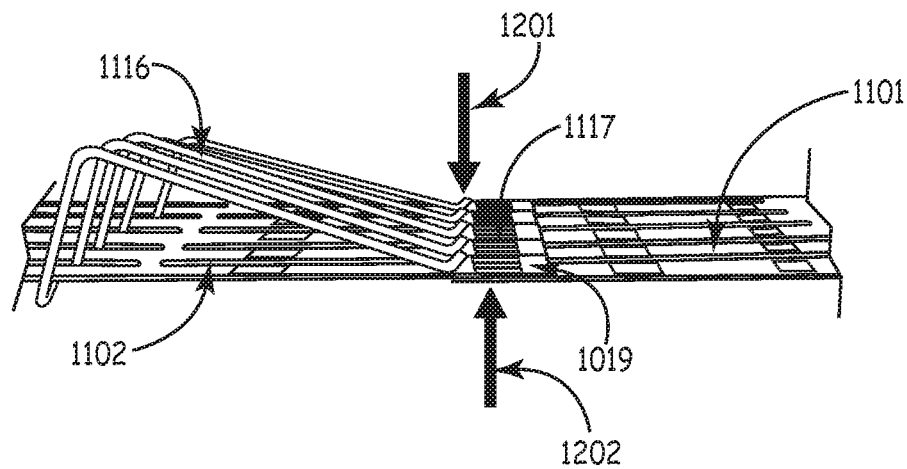
FIG. 24 is a schematic top view of a plurality of circuit board clamps holding top and bottom circuit boards together in accordance with various embodiments herein.
Figure 25:
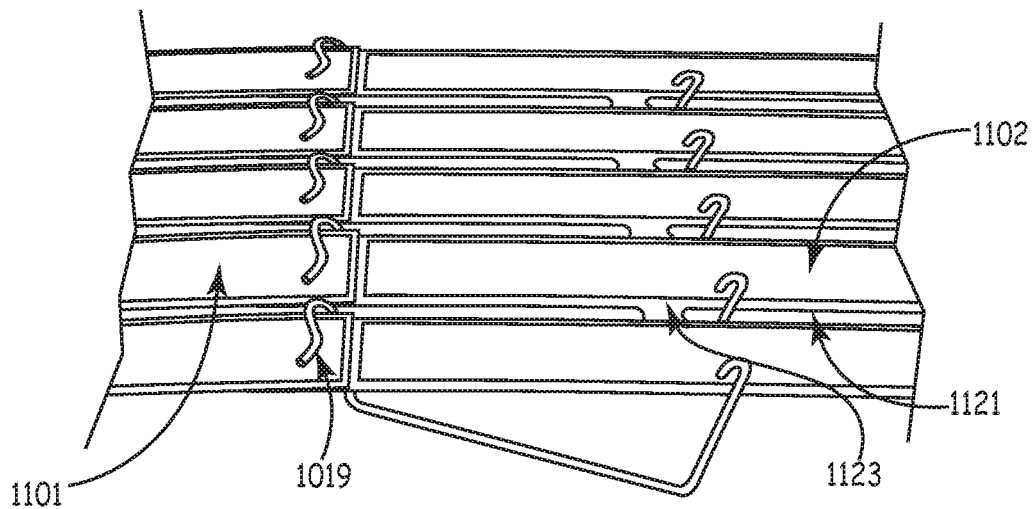
FIG. 25 is a schematic bottom view of a plurality of circuit board clamps holding top and bottom circuit boards together in accordance with various embodiments herein.

FIG. 24 is a schematic top perspective view of a plurality of circuit board clamps 1116 holding top 1102 and bottom 1101 circuit boards together in accordance with various embodiments herein. In reference to FIG. 24, the method of holding involves the application of a downward force 1201 with circuit board clamp 1116 on the top of a prepared lap joint 1117 of the top circuit board 1102 near the intended solder point 1019, an opposing upward force 1202 on the bottom of a prepared lap joint 1117 of the bottom circuit 1101 directly below the intended solder location 1020. The forces are separated by some lateral distance resulting in a force moment at the prepared lap joint 1117 for solder connection. The applied forces and resulting force moment create friction force within the prepared joint. The resulting friction force is sufficient to resist movement due to forces typical in reflow or wave soldering processes and is therefore sufficient to maintain alignment of the top plurality of circuit boards 1101 and bottom plurality of circuit boards 1102 within the prepared lap joint 1117. FIG. 25 is a schematic bottom perspective view of a plurality of circuit board clamps 1116 holding top 1102 and bottom 1101 circuit boards together in accordance with various embodiments herein.

Figure 26:
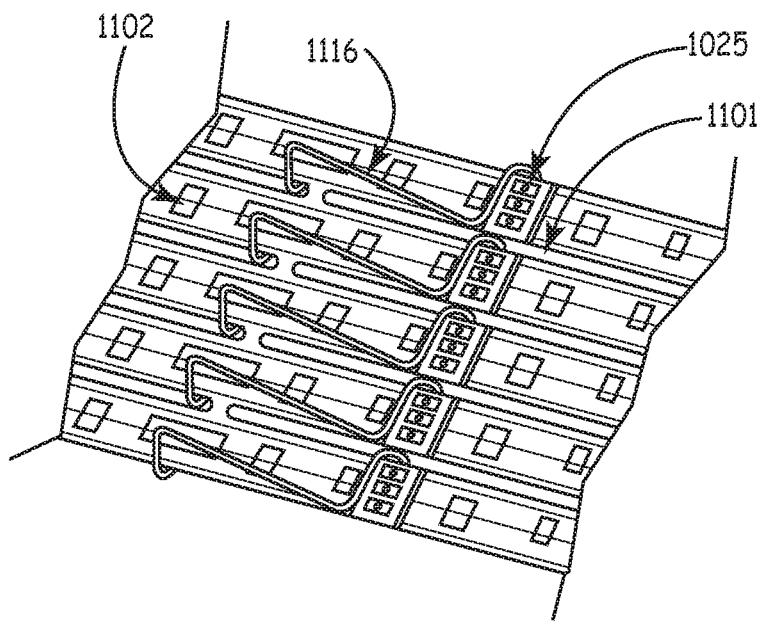
FIG. 26 is a schematic view of a circuit board with circuit board clamps allowing for a visual inspection step in accordance with various embodiments herein.

FIG. 26 is a schematic view of top 1102 and bottom 1101 circuit boards with circuit board clamps 1116 illustrating how the circuit board clamps 1116 allow for a visual inspection step of the through holes 1025 and solder therein in accordance with various embodiments herein.

Figure 27:
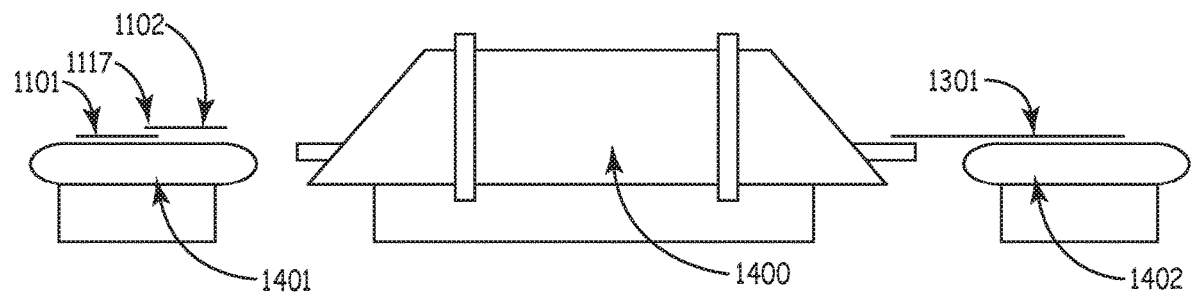
FIG. 27 is a schematic view of a reflow solder oven with conveyor belt feeds in and out of the machine in accordance with various embodiments herein.

In reference to FIG. 27, a reflow soldering process is shown where a plurality of top circuit boards 1102 and a plurality of bottom circuit boards 1101 are held together in a prepared lap joint 1117 and placed onto a conveyor belt 1401 for feeding into reflow solder oven 1400. The resulting reflow soldered long circuit boards 1301 and continuous soldered circuit boards 1302 with soldered lap joints 1015 exit reflow solder oven at conveyor belt 1402.

Figure 28:
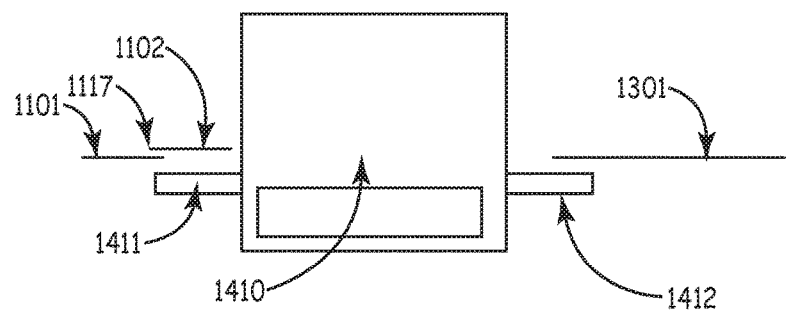
FIG. 28 is a schematic view of a wave solder machine with feeds in and out of tank in accordance with various embodiments herein.

In reference to FIG. 28, a wave soldering process is shown where a plurality of top circuit boards 1102 and a plurality of bottom circuit boards 1101 are held together in a prepared lap joint 1117 and placed onto a wave solder machine 1410 feeder table 1411. The resulting wave soldered long circuit boards 1301 and continuous soldered circuit boards 1302 with soldered lap joints 1124 exit reflow solder oven at exit table 1412.

Pre-Populated Circuit Boards

Figure 22:
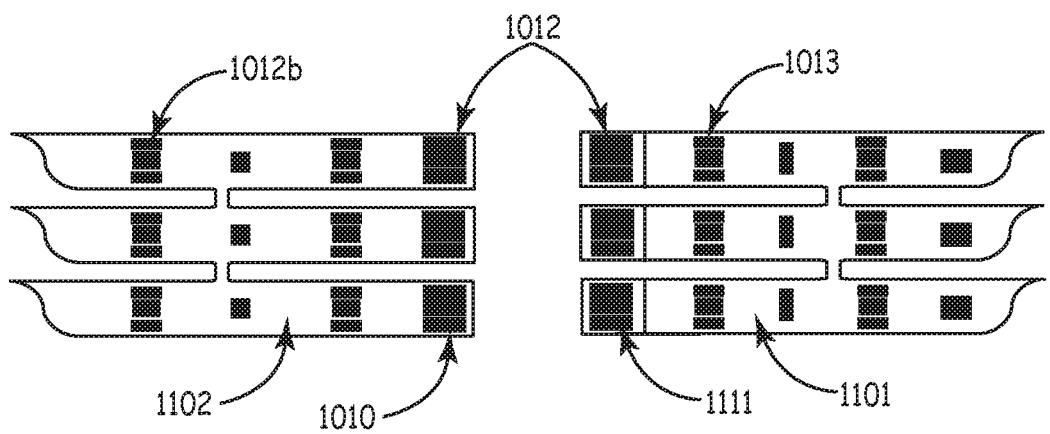
FIG. 22 is a schematic view of a plurality of top and bottom circuit boards each as part of an array of circuit boards arranged parallel to one another with electronic components prepared for soldering in accordance with various embodiments herein.

It will be appreciated that methods in accordance with embodiments herein can be performed with unpopulated circuit boards, pre-populated circuit boards, and pre-populated and pre-soldered circuit boards. By way of example, FIG. 22 shows an embodiment in which the top circuit boards 1102 and bottom circuit boards 1101 may be pre-populated with solder paste 1012b and electronic components 1013 as in conventional preparation of circuit boards for reflow or wave soldering on to the circuit boards. The plurality of populated top circuit boards can then be pre-pared with solder paste 1012 at the solder pads 1010. Solder paste 1012 may also be applied to the plurality of pre-populated bottom circuit boards 1101 at pads 1011 although tests conducted indicated the addition of solder paste on the bottom circuit board 1101 solder pads 1011 was not necessary to achieve reliable solder joints 1124.

Figure 29:
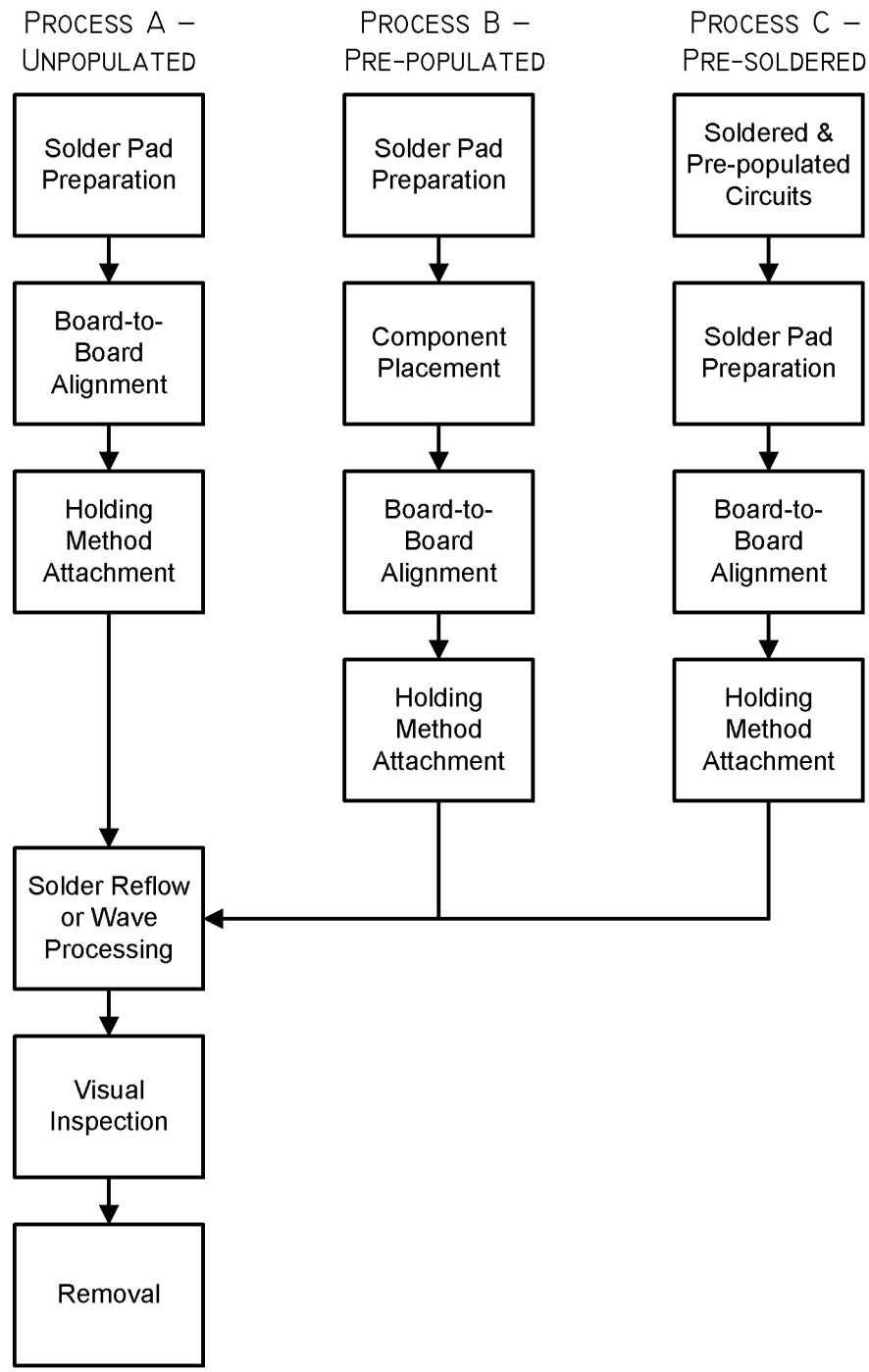
FIG. 29 is a flow diagram of a method with unpopulated, pre-populated, and pre-populated/soldered plurality of circuit boards in accordance with various embodiments herein.

The plurality of pre-populated top circuit boards 1102 can then be aligned over the top of the plurality of pre-populated bottom circuit board 1101 solder pads 1011 and held in place with an apparatus 1116 creating a prepared lap joint 1117 (see e.g., FIG. 16) ready for reflow or wave solder processing. The resulting reliable soldered lap joint 1015 (see, e.g., FIG. 23) can result in a long circuit board assembly 1301 (FIG. 19). The process can be repeated by adding additional top circuit boards 1101 to the newly created long circuit board assembly 1301 to create a long continuous circuit board assembly 1302 (see, e.g., FIG. 23). An example of one method for preparation, alignment, connection, soldering and removal for pre-populated circuit boards is described in FIG. 29 (identified as "Process B—Pre-populated"). It will be appreciated that soldering can include the steps of a heating cycle, solder flow, and a cooling cycle.

The alignment of the top and bottom plurality of circuit boards is aided through initial visual alignment of the solder pad 1010 to solder pad 1011 and board end 1016 and board alignment marks 1014. The top and bottom circuit board alignment for solder processing is then determined by long board edge 1018 and circuit board clamp 1116. The resulting prepared joint 1117 is aligned and held in place with circuit board clamp 1116 for reflow or wave soldering.

Pre-Populated and Pre-Soldered Circuit Boards

Figure 23:
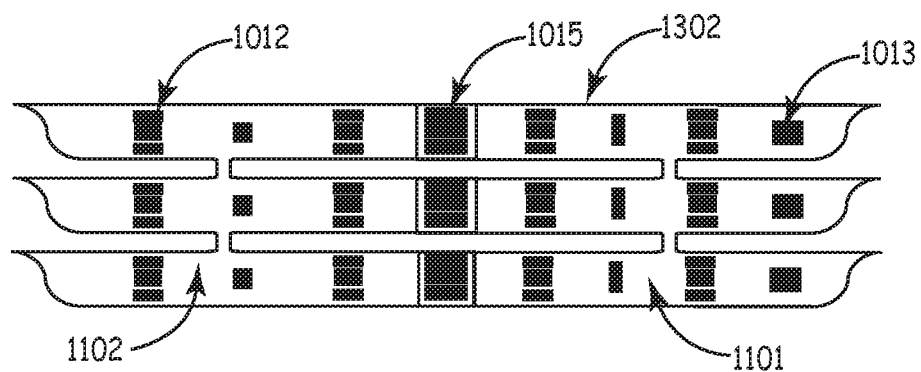
FIG. 23 is a schematic illustration showing the solder connecting a plurality of long continuous circuit boards forming circuit board strips in accordance with various embodiments herein.
Figure 30:
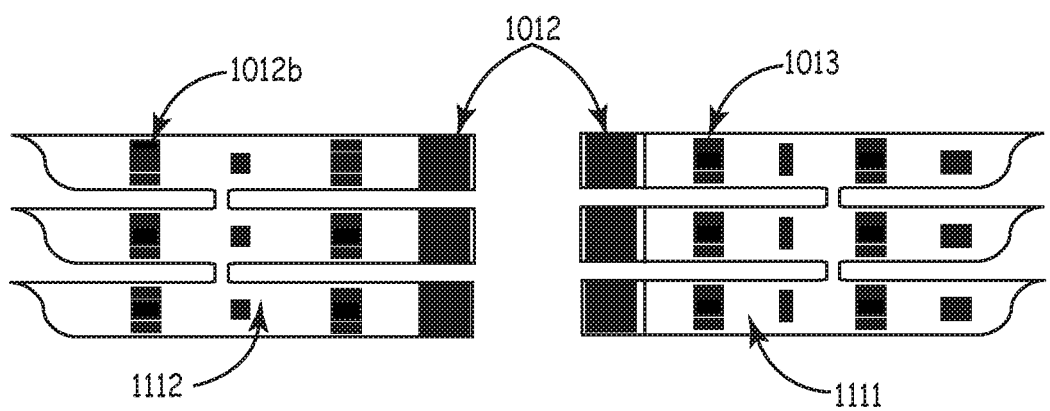
FIG. 30 is a schematic top view of top circuit boards and bottom circuit boards ready for attachment that are pre-populated and pre-soldered with electronic components.

FIG. 30 shows a further embodiment in which the top circuit boards 1112 and bottom circuit boards 1111 both may be pre-populated and pre-soldered with electronic components 1013 soldered onto the plurality of circuit boards. In this embodiment the pre-populated and pre-soldered top circuit boards 1112 can then prepared with solder paste 1012 at the solder pads 1010. Solder paste 1012 can also be added to the plurality of bottom circuit boards 1111, but was found to not be necessary to achieve reliable solder joints 1124. The plurality of pre-populated and pre-soldered top circuit boards 1112 are then aligned over the top of the plurality of pre-populated and pre-soldered bottom circuit boards 1111 for soldering of the prepared lap joint 1117 (FIG. 16) ready for reflow or wave solder processing. The resulting reliable soldered lap joint 1015 (FIG. 23) resulting in a long circuit board assembly 1301 (FIG. 19). The process can be repeated by adding additional top circuit boards 1111 to the newly created long circuit board assembly 1311 to create a long-continuous circuit board assembly 1302 (FIG. 23). An example of one method for preparation, alignment, connection, soldering and removal of pre-populated and pre-soldered circuit boards is described in FIG. 29 (identified as "Process C—Pre-Soldered").

Unpopulated Circuit Boards

Figure 31:
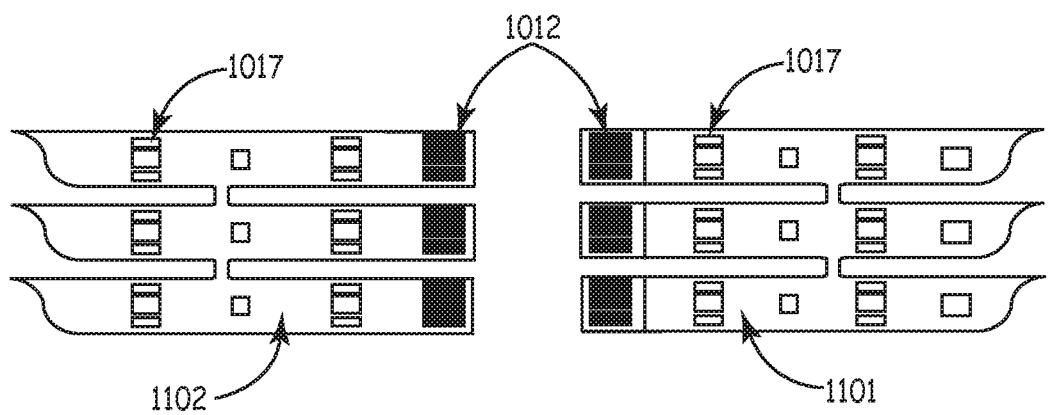
FIG. 31 is a schematic top view of top circuit boards and bottom circuit boards ready for attachment with electrical component positions that are left unpopulated.
Figure 32:
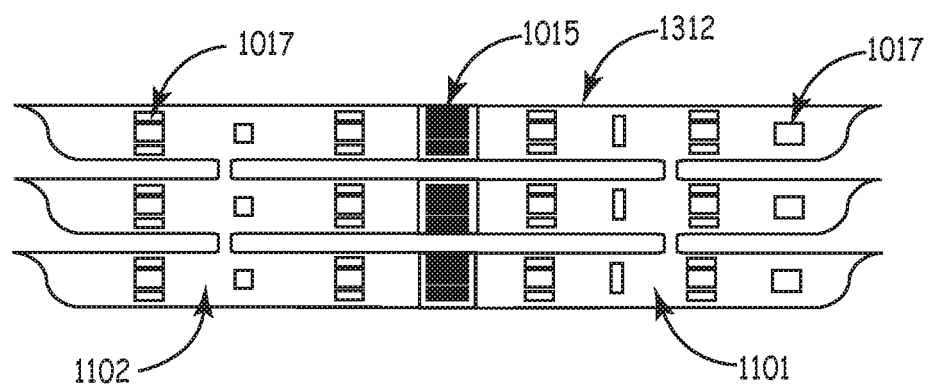
FIG. 32 is a schematic view of a continuous plurality of soldered panelized circuit boards in accordance with various embodiments herein.

FIG. 31 shows a further embodiment included herein where the top circuit boards 1102 and bottom circuit boards 1101 can be left unpopulated and specifically where electrical component positions 1017 can be left unpopulated. The plurality of top circuit boards 1102 can be prepared with solder paste 1012 at the solder pads 1010 for creation of prepared lap joint 1117. Solder paste 1012 can also be added to the plurality of bottom circuit boards 1101, but was found to not be necessary to achieve reliable solder joints 1124. The plurality of pre-populated and pre-soldered top circuit boards 1102 are then aligned over the top of the plurality of pre-populated and pre-soldered bottom circuit boards 1101 for soldering of the prepared lap joint 1117 ready for reflow or wave solder processing. Referring to FIG. 32, the resulting reliable soldered lap joint 1015 resulting in a long circuit board assembly 1311. The process can be repeated by adding additional plurality of top circuit boards 1101 to the newly created long circuit board assembly 1311 to create a long-continuous circuit board assembly 1312. An example of one method for the preparation, alignment, connection, soldering and removal of unpopulated circuit boards is described in FIG. 29 (identified as "Process A—Unpopulated").

Experiments conducted during reflow soldering demonstrated a plurality of circuit boards held by an apparatus 1116 in the form of a prepared joint 1117 (FIG. 16) could be successfully soldered together into a reliable solder joint 1124 (FIG. 19) providing mechanical and electrical connection between the top circuit board 1102 and bottom circuit board 1101.

A number of experiments were previously conducted to determine solder wetting and flow paths for various pad geometries using overlapped boards in surface mount applications. After melting, solder wets to the metal pads and exposed conductors of printed circuit boards. The solder moves through capillary action to actively fill small gaps and spaces between upper and lower board pads, particularly pads in flat surface-to-surface contact as previously disclosed. The high degree of adhesion and capillary action exhibited by liquid solder, combined with the mechanical force moment on the prepared joint 1117 (FIG. 24) provides for reliable soldering of the top circuit board 1102 and bottom circuit board 1101 into reliable solder joint 1124 (FIG. 19).

Further Embodiments

In an embodiment the invention includes a method of connecting a plurality of flexible circuit boards together comprising the steps of applying a solder composition between an upper surface of a first flexible circuit board and a lower surface of a second flexible circuit board; holding the upper surface of the first flexible circuit board and the lower surface of the second flexible circuit board together; and reflowing the solder composition with a heat source to bond the first flexible circuit board and the second flexible circuit board together to form a flexible circuit board strip having a length longer than either of the first flexible circuit board or second flexible circuit board separately. In an embodiment, the method further comprises applying a solder composition between an upper surface of the second flexible circuit board and a lower surface of a third flexible circuit board and holding the upper surface of the second flexible circuit board and the lower surface of the third flexible circuit board together. In an embodiment, the method further comprises applying a solder composition between an upper surface of the third flexible circuit board and a lower surface of a fourth flexible circuit board and holding the upper surface of the third flexible circuit board and the lower surface of the fourth flexible circuit board together. In an embodiment, the method further comprises positioning a plurality of components on at least one of the first and second flexible circuit boards. In an embodiment, the plurality of components can include light emitting diodes. In an embodiment, the method further comprises positioning the plurality of components on the first and second flexible circuit boards takes place before the step of reflowing the solder composition with a heat source and the plurality of components are bonded to at least one of the first and second flexible circuit boards during the step of reflowing the solder composition with a heat source. In an embodiment, holding the upper surface of the first flexible circuit board and the lower surface of the second flexible circuit board together is achieved by positioning a clamp to contact the first flexible circuit board and the second flexible circuit board. In an embodiment, the clamp comprises a u-shaped fastener, a spring tension arm connected to the u-shaped fastener, and an attachment hook connected to the spring tension arm. In an embodiment, the heat source delivers heat from the bottom of the first and second flexible circuit boards. In an embodiment, the heat source delivers heat from the top of the first and second flexible circuit boards. In an embodiment, the heat source delivers heat from the bottom and top of the first and second flexible circuit boards. In an embodiment, the solder composition is selected from the group consisting of solder, solder paste, and solder with flux. In an embodiment, reflowing the solder composition with a heat source results in solder flowing up through a hole in the first flexible circuit board. In an embodiment, the step of confirming bonding of the first flexible circuit board and the second flexible circuit board together by inspection of the solder having flowed up through the hole. In an embodiment, inspection is conducted with a video sensor. In an embodiment, the formation of a dome shaped solder bead atop the hole confirms proper bonding of the first flexible circuit board and the second flexible circuit board together. In an embodiment, the method further includes measuring the height of solder that has flowed up through the hole. In an embodiment, the first and second flexible circuit boards are each part of arrays of circuit boards arranged parallel to one another.

In an embodiment, the invention includes a circuit board clamp for holding flexible circuit boards together. The clamp can include a u-shaped fastener, a spring tension arm connected to the u-shaped fastener, and an attachment mechanism connected to the spring tension arm. In an embodiment, the u-shaped fastener comprises a top bar portion and a bottom bar portion, the bottom bar comprising an end portion bent away from the top bar. In an embodiment, the clamp is formed from a flexible wire. In an embodiment, the spring tension arm is connected to the top bar portion of the u-shaped fastener. In an embodiment, the spring tension arm has a major axis oriented perpendicularly to the top bar portion of the u-shaped fastener. In an embodiment, the attachment mechanism comprises an attachment hook.

It should be noted that, as used in this specification and the appended claims, the singular forms "a," "an," and "the" include plural referents unless the content clearly dictates otherwise. Thus, for example, reference to a composition containing "a compound" includes a mixture of two or more compounds. It should also be noted that the term "or" is generally employed in its sense including "and/or" unless the content clearly dictates otherwise.

It should also be noted that, as used in this specification and the appended claims, the phrase "configured" describes a system, apparatus, or other structure that is constructed or configured to perform a particular task or adopt a particular configuration to. The phrase "configured" can be used interchangeably with other similar phrases such as arranged and configured, constructed and arranged, constructed, manufactured and arranged, and the like.

All publications and patent applications in this specification are indicative of the level of ordinary skill in the art to which this invention pertains. All publications and patent applications are herein incorporated by reference to the same extent as if each individual publication or patent application was specifically and individually indicated by reference.

The invention has been described with reference to various specific and preferred embodiments and techniques. However, it should be understood that many variations and modifications may be made while remaining within the spirit and scope of the invention.

The invention claimed is:

1. A method of connecting a plurality of flexible circuit boards together comprising:

aligning a free end of a first flexible circuit board with a free end of a second flexible circuit board in a partially overlapping joint, wherein the first circuit board comprises a top surface, a bottom surface opposite from the top surface, and a first electrical contact disposed on the first flexible circuit board, and the second circuit board comprises a top surface, a bottom surface opposite from the top surface, and a second electrical contact disposed on the second flexible circuit board;

clamping the first flexible circuit board with the second flexible circuit board with a clamp;

joining the first circuit board with the second circuit board by soldering, such that the solder contacts the first electrical contact and the second electrical contact, wherein the solder is positioned such that the clamp does not apply pressure to both sides of the solder;

positioning at least one component on each of the first and second flexible circuit boards;

applying an adhesive tape to the bottom surface of the first circuit board and the second circuit board, such that the adhesive tape spans across the joint; and winding the joined circuit boards around a reel.

2. The method of connecting a plurality of flexible circuit boards together of claim 1, wherein the clamp is positioned such that the clamp does not contact the first or the second electrical contacts.

3. The method of connecting a plurality of flexible circuit boards together of claim 2, wherein the clamp holds the first flexible circuit board and the second flexible circuit board such that a longitudinal axis of the first flexible circuit board is aligned with a longitudinal axis of the second flexible circuit board.

4. The method of connecting a plurality of flexible circuit boards together of claim 2, wherein the first flexible circuit board defines a through hole that extends through the first electrical contact, and the second flexible circuit board defines a through hole that extends through the second electrical contact.

5. The method of connecting a plurality of flexible circuit boards together of claim 4, wherein joining the first circuit board and the second circuit board by soldering comprises flowing solder through both of the through holes.

6. The method of connecting a plurality of flexible circuit boards together of claim 2, wherein the first flexible circuit board with a top first electrical contact, and the second flexible circuit board defines a through hole that extends through the second electrical contact.

7. The method of connecting a plurality of flexible circuit boards together of claim 6, wherein joining the first circuit board and the second circuit board by soldering comprises flowing solder on the top first electrical contact and through the through hole of the second electrical contact.

8. The method of connecting a plurality of flexible circuit boards together of claim 2, wherein the at least one component comprises at least one light emitting diode.

9. The method of connecting a plurality of flexible circuit boards together of claim 2, further comprising: applying a substance that extends from the top surface of the first flexible circuit board to the top surface of the second flexible circuit board.

10. The method of connecting a plurality of flexible circuit boards together of claim 9, wherein the substance includes a potting material.

11. A method of connecting a plurality of flexible circuit boards together comprising:

aligning a free end of a first flexible circuit board with a free end of a second flexible circuit board in a first partially overlapping joint, wherein the first circuit board comprises a top surface, a bottom surface opposite from the top surface, and a first electrical contact disposed on the first flexible circuit board, and the second circuit board comprises a top surface, a bottom surface opposite from the top surface, and a second electrical contact and a third electrical contact disposed on the second flexible circuit board;

clamping the first flexible circuit board with the second flexible circuit board with a clamp;

joining the first circuit board with the second circuit board by soldering, such that the solder contacts the first electrical contact and the second electrical contact, wherein the solder is positioned such that the clamp does not apply pressure to both sides of the solder;

aligning a second free end of the second flexible circuit board with a free end of a third flexible circuit board in a second partially overlapping joint, wherein the third circuit board comprises a top surface, a bottom surface opposite from the top surface, and a fourth electrical contact disposed on the third flexible circuit board;

clamping the second flexible circuit board with the third flexible circuit board with a second clamp;

joining the second circuit board with the third circuit board by soldering, such that the solder contacts the third electrical contact and the fourth electrical contact, wherein the solder is positioned such that the second clamp does not apply pressure to both sides of the solder;

positioning at least one light emitting diode on each of the first, second, and third flexible circuit boards;

applying an adhesive tape to the bottom surface of the first circuit board, the second circuit board, and the third circuit board, such that the adhesive tape spans across the first joint and the second joint; and winding the joined circuit boards around a reel.

12. The method of connecting a plurality of flexible circuit boards together of claim 11, further comprising: applying a substance that extends from the top surface of the first flexible circuit board to the top surface of the second flexible circuit board.

* * * * *